United States Patent
Zou et al.

(10) Patent No.: US 10,425,659 B2
(45) Date of Patent: Sep. 24, 2019

(54) CODING ESCAPE PIXELS FOR PALETTE CODING

(71) Applicant: QUALCOMM Incorporated, San Diego, CA (US)

(72) Inventors: Feng Zou, San Diego, CA (US); Rajan Laxman Joshi, San Diego, CA (US); Marta Karczewicz, San Diego, CA (US); Vadim Seregin, San Diego, CA (US); Wei Pu, Pittsburgh, PA (US)

(73) Assignee: QUALCOMM Incorporated, San Diego, CA (US)

(*) Notice: Subject to any disclaimer, the term of this patent is extended or adjusted under 35 U.S.C. 154(b) by 307 days.

(21) Appl. No.: 15/009,678

(22) Filed: Jan. 28, 2016

(65) Prior Publication Data

US 2016/0227247 A1 Aug. 4, 2016

Related U.S. Application Data

(60) Provisional application No. 62/110,395, filed on Jan. 30, 2015, provisional application No. 62/110,995, filed on Feb. 2, 2015.

(51) Int. Cl.
*H04N 19/597* (2014.01)
*H03M 7/40* (2006.01)
(Continued)

(52) U.S. Cl.
CPC .......... *H04N 19/597* (2014.11); *H03M 7/40* (2013.01); *H03M 7/4075* (2013.01); *H04N 19/105* (2014.11); *H04N 19/117* (2014.11); *H04N 19/124* (2014.11); *H04N 19/13* (2014.11); *H04N 19/137* (2014.11);
(Continued)

(58) Field of Classification Search
None
See application file for complete search history.

(56) References Cited

U.S. PATENT DOCUMENTS

| 2010/0124272 A1* | 5/2010 | Fein | H03M 7/40 |
| | | | 375/240.01 |
| 2015/0264365 A1* | 9/2015 | Tsai | H04N 19/94 |
| | | | 375/240.03 |

(Continued)

FOREIGN PATENT DOCUMENTS

WO 2015006724 A2 1/2015

OTHER PUBLICATIONS

Sze et al, "High Efficiency Video Coding (HEVC) : Algorithms and Architectures—Chapter 8: Entropy Coding in HEVC," Jan. 2014, Springer International Publishing, XP055263413, ISBN: 978-3-319-06894-7 pp. 209-269.*

(Continued)

*Primary Examiner* — William C Vaughn, Jr.
*Assistant Examiner* — Stuart D Bennett
(74) *Attorney, Agent, or Firm* — Shumaker & Sieffert, P.A.

(57) ABSTRACT

In one example, a device includes a memory configured to store video data and a video decoder configured to decode an exponential Golomb codeword representative of at least a portion of a value for an escape pixel of a palette-mode coded block of video data, the video decoder is configured to decode the exponential Golomb codeword using exponential Golomb with parameter 3 decoding, and decode the block using the value for the escape pixel.

46 Claims, 7 Drawing Sheets

(51) Int. Cl.
  H04N 19/13    (2014.01)
  H04N 19/593   (2014.01)
  H04N 19/91    (2014.01)
  H04N 19/182   (2014.01)
  H04N 19/105   (2014.01)
  H04N 19/117   (2014.01)
  H04N 19/124   (2014.01)
  H04N 19/137   (2014.01)
  H04N 19/186   (2014.01)
  H04N 19/44    (2014.01)
  H04N 19/52    (2014.01)
  H04N 19/61    (2014.01)
  H04N 19/93    (2014.01)
  H04N 19/96    (2014.01)

(52) U.S. Cl.
  CPC ......... H04N 19/182 (2014.11); H04N 19/186 (2014.11); H04N 19/44 (2014.11); H04N 19/52 (2014.11); H04N 19/593 (2014.11); H04N 19/61 (2014.11); H04N 19/91 (2014.11); H04N 19/93 (2014.11); H04N 19/96 (2014.11)

(56) References Cited

U.S. PATENT DOCUMENTS

2016/0295214 A1   10/2016  Gamei et al.
2017/0111651 A1   4/2017   Chuang et al.
2017/0171560 A1*  6/2017   Kim ..................... H04N 19/593

OTHER PUBLICATIONS

Sze et al, "High Efficiency Video Coding (HEVC) : Algorithms and Architectures—Chapter 8: Entropy Coding in HEVC," Jan. 2014, Springer International Publishing, XP055263413, ISBN: 978-3-319-06894-7 pp. 209-269. (Year: 2014).*
Guo, et al., "RCE3: Results of Test 3.1 on Palette Mode for Screen Content Coding," JCT-VC Meeting; Jul. 25-Aug. 2, 2013; Vienna; (Joint Collaborative Team on Video Coding of ISO/IEC JTC1/SC29/WG11 and ITU-T SG.16); URL: http://wftp3.itu.int/av-arch/jctvc-site/, No. JCTVC-N0247, Jul. 16, 2013, XP030114764, 7 pp.
Guo, et al., "AHG8: Major-color-based Screen Content Coding," JCT-VC Meeting; Oct. 23-Nov. 1, 2013; Geneva; (Joint Collaborative Team on Video Coding of ISO/IEC JTC1/SC29/WG11 and ITU-T SG.16); URL: http://wftp3.itu.int/av-arch/jctvc-site/, No. JCTVC-O0182, Oct. 14, 2013, XP030115218, 7 pp.
International Search Report and Written Opinion from International Application No. PCT/US2016/015707, dated Apr. 19, 2016, 18 pp.
"TComDataCU.cpp source: tags /HM-16.2+SCM-3.0 / source / Lib / TLibCommon TComDataCU.cpp," Nov. 12, 2014, XP055263001, Retrieved on Apr. 5, 2016 from the Internet: URL:https://hevc.hhi.fraunhofer.de/trac/hevc/browser/tags/HM-16.2%2BSCM-3.0/source/Lib/TLibCommon/TComDataCU.cpp, 77 pp.
"Proof of Dates of Files in HM-16.2+SCM-3.0" In: "Proof of dates of files in HM-16.2+SCM-3.0", Apr. 6, 2016, XP055264052, 7 pp.
Sharman, et al., "AHG18: Worst-case Escape Code Length Mitigation," JCT-VC Meeting, Mar. 27-Apr. 4, 2014; Valencia; (Joint Collaborative Team on Video Coding of ISO/IEC JTC1/SC29/WG11 and ITU-T SG.16 ); URL: http://wftp3.itu.int/av-arch/jctvc-site/, No. JCTVC-Q0073-v2, Mar. 24, 2014, XP030115973, 6 pp.
Sze, et al., "High Efficiency Video Coding (HEVC) : Algorithms and Architectures—Chapter 8: Entropy Coding in HEVC" In: "High Efficiency Video Coding (HEVC) : Algorithms and Architectures—Chapter 8: Entropy Coding in HEVC," Jan. 2014, Springer International Publishing, XP055263413, ISBN: 978-3-319-06894-7 pp. 209-269.

"TEncSbacsource: tags / HM-16.2+SCM-3.0 / source / Lib / TLibEncoder /TEncSbac.cpp," Nov. 11, 2014, XP055263026, Retrieved on Apr. 5, 2016 from the Internet: URL:https://hevc.hhi.fraunhofer.de/trac/hevc/browser/tags/HM-16.2%2BSCM-3.0/source/Lib/TLibEncoder/TEncSbac.cpp, 51 pp.
Xiu, et al., "Non-CE1: On Escape Color Coding for Palette Coding Mode," JCT-VC Meeting; Feb. 10-18, 2015; Geneva; (Joint Collaborative Team on Video Coding of ISO/IEC JTC1/SC29/WG11 and ITU-T SG.16 ); URL: http://wftp3.itu.int/av-arch/jctvc-site/,No. JCTVC-T0118, Jan. 31, 2015, XP030117264 10 pp.
Zhang, et al., "CE1-related: Table Based Binarization for Palette Escape_val," JCT-VC Meeting; Feb. 10-18, 2015; Geneva; (Joint Collaborative Team on Video Coding of ISO/IEC JTC1/SC29/WG11 and ITU-T SG.16); URL: http://wftp3.itu.int/av-arch/jctvc-site/, No. JCTVC-T0060, Jan. 30, 2015, XP030117181, 3 pp.
Zou, et al., "CE1 Related: On Escape Pixel Coding for Palette Mode," JCT-VC Meeting; Feb. 10-18, 2015; Geneva; (Joint Collaborative Team on Video Coding of ISO/IEC JTC1/SC29/WG11 and ITU-T SG.16 ); URL: http://wftp3.itu.int/av-arch/jctvc-site/,, No. JCTVC-T0112-v3, Feb. 10, 2015, XP030117256, 9 pp.
Inac, et al., "A Phased Array RFIC With Built-In Self-Test Capabilities," IEEE Transactions on Microwave Theory and Techniques, vol. 60, No. 1, Jan. 2012, pp. 139-148.
Guo, et al., "Palette Mode for Screen Content Coding," JCT-VC Meeting; Apr. 18-26, 2013; (Joint Collaborative Team on Video Coding of ISO/IEC JTC1/SC29/WG11 and ITU-T SG.16 ); document No. JCTVC-M0323; Apr. 8, 2013, 5 pp.
Guo, et al., "Palette Mode for Screen Content Coding," JCT-VC Meeting; Apr. 18-26, 2013; (Joint Collaborative Team on Video Coding of ISO/IEC JTC1/SC29/WG11 and ITU-T SG.16 ); document No. JCTVC-M0323; Apr. 17, 2013, 6 pp.
Guo, et al., "Palette Mode for Screen Content Coding," JCT-VC Meeting; Apr. 18-26, 2013; (Joint Collaborative Team on Video Coding of ISO/IEC JTC1/SC29/WG11 and ITU-T SG.16 ); document No. JCTVC-M0323; Apr. 20, 2013, 12 pp.
Guo, et al., "Non-RCE3: Modified Palette Mode for Screen Content Coding," JCT-VC Meeting; Jul. 25-Aug. 2, 2013; (Joint Collaborative Team on Video Coding of ISO/IEC JTC1/SC29/WG11 and ITU-T SG.16 ); document No. JCTVC-N0249, Jul. 16, 2013; 6 pp.
Flynn, et al. "High Efficiency Video Coding (HEVC) Range Extensions text specification: Draft 7," JCT-VC Meeting; Mar. 27-Apr. 4, 2014; (Joint Collaborative Team on Video Coding of ISO/IEC JTC1/SC29/WG11 and ITU-T SG.16 ); No. JCTVC-Q1005_v4; 379 pp.
Joshi, et al., "High Efficiency Video Coding (HEVC) Screen Content Coding: Draft 2," JCT-VC Meeting; Jun. 30-Jul. 9, 2014; (Joint Collaborative Team on Video Coding of ISO/IEC JTC1/SC29/WG11 and ITU-T SG.16 ); document No. JCTVC-51005, 380 pp.
ITU-T H.265, Series H: Audiovisual and Multimedia Systems, Infrastructure of audiovisual services—Coding of moving video, Advanced video coding for generic audiovisual services, The International Telecommunication Union. Oct. 2014, 540 pp.
Bross, et al., "High Efficiency Video Coding (HEVC) text specification draft 10 (for FDIS & Last Call)," JCT-VC Meeting; Jan. 14-23, 2013; (Joint Collaborative Team on Video Coding of ISO/IEC JTC1/SC29/WG11 and ITU-T SG.16 ); document No. JCTVC-L1003_v34, 310 pp.
ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.
Response to Written Opinion dated Apr. 19, 2016, from International Application No. PCT/US2016/015707, filed Nov. 29, 2016, 7 pp.
Second Written Opinion from International Application No. PCT/US2016/015707, dated Dec. 22, 2016, 5 pp.
International Preliminary Report on Patentability issued in International Application No. PCT/US2016/015707 dated Apr. 13, 2017, 29 pp.

* cited by examiner

CODING ESCAPE PIXELS FOR PALETTE CODING

This application claims the benefit of U.S. Provisional Application No. 62/110,395, filed Jan. 30, 2015, and U.S. Provisional Application No. 62/110,995, filed Feb. 2, 2015, the entire contents of each of which are hereby incorporated by reference.

TECHNICAL FIELD

This disclosure relates to encoding and decoding blocks of video data.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, e-book readers, digital cameras, digital recording devices, digital media players, video gaming devices, video game consoles, cellular or satellite radio telephones, so-called "smart phones," video teleconferencing devices, video streaming devices, and the like. Digital video devices implement video compression techniques, such as those described in the standards defined by MPEG-2, MPEG-4, ITU-T H.263, ITU-T H.264/MPEG-4, Part 10, Advanced Video Coding (AVC), ITU-T H.265 (also referred to as High Efficiency Video Coding (HEVC)), and extensions of such standards. The video devices may transmit, receive, encode, decode, and/or store digital video information more efficiently by implementing such video compression techniques.

Video compression techniques perform spatial (intra-picture) prediction and/or temporal (inter-picture) prediction to reduce or remove redundancy inherent in video sequences. For block-based video coding, a video slice (i.e., a video frame or a portion of a video frame) may be partitioned into video blocks. Video blocks in an intra-coded (I) slice of a picture are encoded using spatial prediction with respect to reference samples in neighboring blocks in the same picture. Video blocks in an inter-coded (P or B) slice of a picture may use spatial prediction with respect to reference samples in neighboring blocks in the same picture or temporal prediction with respect to reference samples in other reference pictures. Pictures may be referred to as frames, and reference pictures may be referred to as reference frames.

Spatial or temporal prediction results in a predictive block for a block to be coded. Residual data represents pixel differences between the original block to be coded and the predictive block. An inter-coded block is encoded according to a motion vector that points to a block of reference samples forming the predictive block, and the residual data indicates the difference between the coded block and the predictive block. An intra-coded block is encoded according to an intra-coding mode and the residual data. For further compression, the residual data may be transformed from the pixel domain to a transform domain, resulting in residual coefficients, which then may be quantized. The quantized coefficients, initially arranged in a two-dimensional array, may be scanned in order to produce a one-dimensional vector of coefficients, and entropy coding may be applied to achieve even more compression.

A multiview coding bitstream may be generated by encoding views, e.g., from multiple perspectives. Some three-dimensional (3D) video standards have been developed that make use of multiview coding aspects. For example, different views may transmit left and right eye views to support 3D video. Alternatively, some 3D video coding processes may apply so-called multiview plus depth coding. In multiview plus depth coding, a 3D video bitstream may contain not only texture view components, but also depth view components. For example, each view may comprise one texture view component and one depth view component.

SUMMARY

In general, this disclosure describes techniques related to coding video data using palette mode. More particularly, the techniques of this disclosure are directed to coding escape pixels in palette mode coded blocks. For example, this disclosure describes techniques for coding escape pixels using a truncated codeword, based on the determination of a maximum quantized escape pixel value. This disclosure also describes various techniques for determining the maximum quantized escape pixel value. Furthermore, this disclosure describes techniques for coding an escape pixel value in two portions, e.g., coding the first portion using Golomb rice coding and the second portion using exponential Golomb coding with parameter 3.

In one example, a method of decoding video data includes decoding an exponential Golomb codeword representative of at least a portion of a value for an escape pixel of a palette-mode coded block of video data, wherein decoding the exponential Golomb codeword comprises decoding the exponential Golomb codeword using exponential Golomb with parameter 3 decoding, and decoding the block using the value for the escape pixel.

In another example, a device for decoding video data includes a memory configured to store video data, and a video decoder configured to decode an exponential Golomb codeword representative of at least a portion of a value for an escape pixel of a palette-mode coded block of video data, wherein the video decoder is configured to decode the exponential Golomb codeword using exponential Golomb with parameter 3 decoding, and decode the block using the value for the escape pixel.

In another example, a device for decoding video data includes means for decoding an exponential Golomb codeword representative of at least a portion of a value for an escape pixel of a palette-mode coded block of video data, wherein the means for decoding the exponential Golomb codeword comprise means for decoding the exponential Golomb codeword using exponential Golomb with parameter 3 decoding, and means for decoding the block using the value for the escape pixel.

In another example, a computer-readable storage medium has stored thereon instructions that, when executed, cause one or more processors to decode an exponential Golomb codeword representative of at least a portion of a value for an escape pixel of a palette-mode coded block of video data, wherein the instructions that cause the processors to decode the exponential Golomb codeword comprise instructions that cause the processors to decode the exponential Golomb codeword using exponential Golomb with parameter 3 decoding, and decode the block using the value for the escape pixel.

In another example, a method of encoding video data includes determining a value for an escape pixel of a palette-mode coded block of video data, and encoding an exponential Golomb codeword representative of at least a portion of the value for the escape pixel, wherein encoding the exponential Golomb codeword comprises encoding the exponential Golomb using exponential Golomb with parameter 3 encoding.

In another example, a device for encoding video data includes a memory configured to store video data and a video encoder configured to determine a value for an escape pixel of a palette-mode coded block of video data, and encode an exponential Golomb codeword representative of at least a portion of the value for the escape pixel, wherein the video encoder is configured to encode the exponential Golomb codeword using exponential Golomb with parameter 3 encoding.

In another example, a device for encoding video data includes means for determining a value for an escape pixel of a palette-mode coded block of video data, and means for encoding an exponential Golomb codeword representative of at least a portion of the value for the escape pixel, wherein the means for encoding the exponential Golomb codeword comprises means for encoding the exponential Golomb codeword using exponential Golomb with parameter 3 encoding.

In another example, a computer-readable storage medium has stored thereon instructions that, when executed, cause one or more processors to determine a value for an escape pixel of a palette-mode coded block of video data, and encode an exponential Golomb codeword representative of at least a portion of the value for the escape pixel, wherein the instructions that cause the processors to encode the exponential Golomb codeword comprise instructions that cause the processors to encode the exponential Golomb codeword using exponential Golomb with parameter 3 encoding.

The details of one or more examples are set forth in the accompanying drawings and the description below. Other features, objects, and advantages will be apparent from the description and drawings, and from the claims.

DETAILED DESCRIPTION

Figure 1:
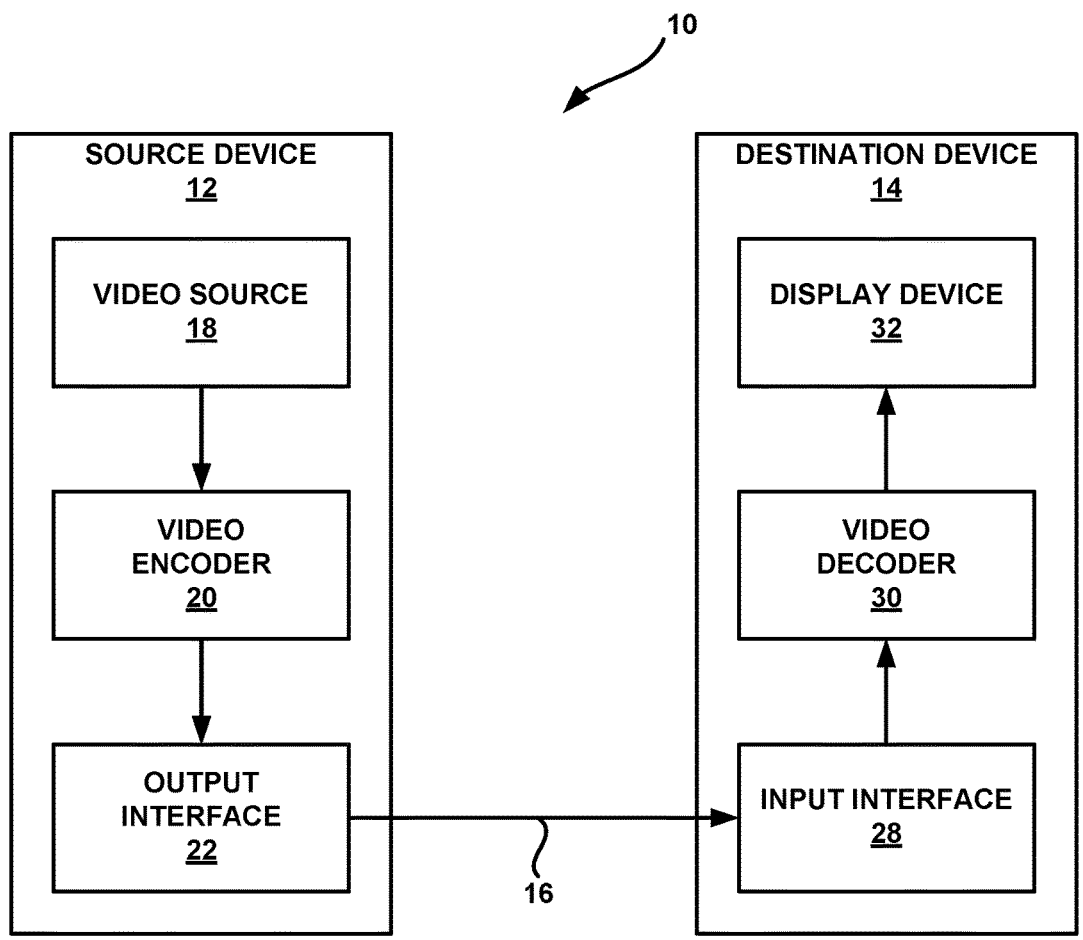
FIG. 1 is a block diagram illustrating an example video coding system that may utilize the techniques described in this disclosure.

This disclosure provides techniques that are directed to escape pixel coding for palette coding, and more specifically, deriving a maximum quantized escape pixel value. In some examples, techniques proposed in this disclosure may remove or eliminate one or more calculations that use encoder dependent parameters and/or division operations to derive a maximum quantized escape pixel value. In some examples, this disclosure provides a new codeword, which may be designed independently of the maximum quantized escape pixel value.

In some examples, techniques of this disclosure may not use encoder dependent parameters to derive maximum quantized escape pixel value at the decoder. Instead, techniques of this disclosure may only use the quantization step size in parameter derivation. Furthermore, in some examples, techniques of this disclosure may use addition and comparison instead of division operations during deriving the maximum quantized escape pixel value.

In some examples, techniques of this disclosure may use encoder parameters to derive maximum quantized escape value at the decoder. Thus, techniques of this disclosure may store encoder related parameters in a lookup table at the decoder side. Furthermore, techniques of this disclosure may use loop or shift operations to derive the maximum number of bits to represent the quantized escape value.

In some examples, techniques of this disclosure may use encoder parameters to derive maximum quantized escape value without clipping and division operations. Thus, techniques of this disclosure may store encoder related parameters in a lookup table at the decoder side. As further described in this disclosure, in some examples, techniques of this disclosure may derive the maximum quantized escape pixel value using a quantization parameter qP and color component bitDepth. Specifically, techniques of this disclosure may obtain a cMax value using a look-up table with qP and bitDepth.

In traditional video coding, images are assumed to be continuous-tone and spatially smooth. Based on these assumptions, various tools have been developed, such as block-based transform, filtering, etc., and such tools have shown good performance for natural content videos. In applications like remote desktop, collaborative work and wireless display, however, computer generated screen content (e.g., such as text or computer graphics) may be the dominant content to be compressed. This type of content tends to have discrete-tone, and feature sharp lines and high-contrast object boundaries. The assumption of continuous-tone and smoothness may no longer apply for screen content, and thus traditional video coding techniques may not be efficient ways to compress video data including screen content.

This disclosure describes palette-based coding, which may be particularly suitable for screen generated content coding. For example, assuming that a particular area of video data has a relatively small number of colors, a video coder (e.g., a video encoder or video decoder) may form a so-called "palette" to represent the video data of the particular area. The palette may be expressed as a table of colors or pixel values representing the video data of the particular area (e.g., a given block). For example, the palette may include the most dominant pixel values in the given block. In some cases, the most dominant pixel values may include the one or more pixel values that occur most frequently within the block. Additionally, in some cases, a video coder may apply a threshold value to determine whether a pixel value is to be included as one of the most dominant pixel values in the block. According to various aspects of palette-based coding, the video coder may code index values indicative of one or more of the pixel values of the current block, instead of coding actual pixel values or their residuals for a current block of video data. In the context of palette-based coding, the index values indicate respective entries in the palette that are used to represent individual pixel values of the current block.

For example, the video encoder may encode a block of video data by determining the palette for the block (e.g., coding the palette explicitly, predicting the palette, or a combination thereof), locating an entry in the palette to represent one or more of the pixel values, and encoding the block with index values that indicate the entry in the palette used to represent the pixel values of the block. In some examples, the video encoder may signal the palette and/or the index values in an encoded bitstream. In turn, the video decoder may obtain, from an encoded bitstream, a palette for a block, as well as index values for the individual pixels of the block. The video decoder may relate the index values of the pixels to entries of the palette to reconstruct the various pixel values of the block.

More particularly, pixels of a block coded using palette mode may be coded using an "index" mode, in which a pixel is coded using a reference to the palette, or a copy from above mode, in which the pixel is coded using a reference to an above-neighboring pixel. A third option is to code the pixel as an escape pixel. In this case, the value of the pixel (or a quantized value for the pixel) is signaled directly.

In accordance with techniques of this disclosure, video coders (e.g., video encoders and video decoders) may be configured to entropy code a quantized value for an escape pixel using a combination of entropy coding modes. In particular, in one example, the video coder codes a first portion of the quantized value for the escape pixel using Golomb rice coding, and a second portion of the quantized value using exponential Golomb with parameter 3. For many syntax elements, exponential Golomb with parameter 3 has yielded relatively poor performance, but heuristic testing has revealed unexpectedly high performance when entropy coding quantized values for escape pixels using exponential Golomb with parameter 3.

Accordingly, a video encoder may first determine to encode a block of pixels (e.g., a coding unit (CU) or a prediction unit (PU)) using palette mode. The video encoder may analyze the pixels to form the palette for the block, and then scan the pixels to determine a pixel-based coding mode for each pixel. For example, the video encoder may select index mode for a pixel if the value of the pixel is included in the palette, copy-from-above mode if the pixel has a value that is equal to the above-neighboring pixel, or escape mode if the pixel is not in the palette and also cannot be copied from above. When the video encoder determines that a pixel is to be coded using escape mode, the video encoder may entropy encode the value of the pixel as a first portion and a second portion, where the first portion and the second portion, when concatenated, represent the full value for the pixel. In particular, the video encoder may encode the first portion using Golomb rice coding and the second portion using exponential Golomb with parameter 3. In addition, the video encoder may signal that the pixel is coded using escape mode by signaling an index value that is equal to the size of the palette for the block. The video encoder may also encode the palette for the block, e.g., using a palette of a previously coded block as a reference palette.

A video decoder, likewise, may receive encoded data for the block. The encoded data may include data indicating that the block is predicted using palette mode, data representative of the palette (e.g., an encoded version of the palette), and data representing values and encoding modes for each of the pixels of the block. Furthermore, for each escape mode encoded pixel, the video decoder may entropy decode a first portion of a value of the pixel using Golomb rice coding and a second portion of the value using exponential Golomb with parameter 3, and then concatenate the first and second portions to reproduce the value of the pixel.

Video coding standards include ITU-T H.261, ISO/IEC MPEG-1 Visual, ITU-T H.262 or ISO/IEC MPEG-2 Visual, ITU-T H.263, ISO/IEC MPEG-4 Visual and ITU-T H.264 (also known as ISO/IEC MPEG-4 AVC), including its Scalable Video Coding (SVC) and Multiview Video Coding (MVC) extensions.

Recently, the design of a new video coding standard, namely High-Efficiency Video Coding (HEVC), has been finalized by the Joint Collaboration Team on Video Coding (JCT-VC) of ITU-T Video Coding Experts Group (VCEG) and ISO/IEC Motion Picture Experts Group (MPEG). The latest HEVC specification, referred to as HEVC Version 1 hereinafter, is described in ITU-T H.265, available from http://www.itu.int/rec/T-REC-H.265-201304-I. The Range Extensions to HEVC, namely HEVC-Rext, is also being developed by the JCT-VC. A recent Working Draft (WD) of Range extensions, referred to as RExt WD7 hereinafter, is available from phenix.int-evry.fr/jct/doc_end_user/documents/17_Valencia/wg11/JCTVC-Q1005-v4.zip.

Recently, JCT-VC has started the development of screen content coding (SCC), which is based on the HEVC-Rext and certain major techniques are under consideration. A draft document (R. Joshi, J. Xu, "HEVC Screen Content Coding Draft Text 2," JCTVC-S1005) describing HEVC screen content coding can be found at hevc.hhi.fraunhofer.de/svn/svn_HEVC Software/tags/HM-16.2+SCM-3.0.

In some examples, palette-based coding techniques may be configured for use in one or more coding modes of the HEVC standard or the HEVC SCC standard. In other examples, palette-based coding techniques can be used independently or as part of other existing or future systems or standards. In some examples, the techniques for palette-based coding of video data may be used with one or more other coding techniques, such as techniques for inter-predictive coding or intra-predictive coding of video data. For example, as described in greater detail below, an encoder or decoder, or combined encoder-decoder (codec), may be configured to perform inter- and intra-predictive coding, as well as palette-based coding.

With respect to the HEVC framework, as an example, the palette-based coding techniques may be configured to be used as a coding unit (CU) mode. In other examples, the palette-based coding techniques may be configured to be used as a prediction unit (PU) mode in the framework of HEVC. Accordingly, all of the following disclosed processes described in the context of a CU mode may, additionally or alternatively, apply to PU. However, these HEVC-based examples should not be considered a restriction or limitation of the palette-based coding techniques described herein, as such techniques may be applied to work independently or as part of other existing or yet to be developed systems/standards. In these cases, the unit for palette coding can be square blocks, rectangular blocks or even regions of non-rectangular shape.

The basic idea of palette-based coding is that, for each coding unit (CU), a palette is derived that comprises (and may consist of) the most dominant pixel values in the current CU. The size and the elements of the palette are first transmitted from a video encoder to a video decoder. The size and/or the elements of the palette can be directly coded or predictively coded using the size and/or the elements of the palette in the neighboring CUs (e.g. above and/or left coded CU). After that, the pixel values in the CU are encoded based on the palette according to a certain scanning order. For each pixel location in the CU, a flag, e.g., palette_flag, is first transmitted to indicate whether the pixel value is included in the palette. For those pixel values that map to an entry in the palette, the palette index associated with that entry is signaled for the given pixel location in the CU. For those pixel values that do not exist in the palette, a special index may be assigned to the pixel and the actual pixel value is transmitted for the given pixel location in the CU. These pixels are referred to as "escape pixels." An escape pixel can be coded using any existing entropy coding method such as fixed length coding, unary coding, etc.

This disclosure describes methods to support coding of video content, especially screen content with palette coding. The proposed methods are mainly concerned with escape pixel coding for palette mode coding.

Based on the characteristics of screen content video, palette coding was introduced to improve SCC efficiency described in JCTVC-M0323. Specifically, palette coding introduces a lookup table, i.e., a color palette, to compress repetitive pixel values based on the fact that in SCC, colors within one CU usually concentrate on a few peak values. Given a palette for a specific CU, pixels within the CU are mapped to the palette index. In the second stage, an effective copy from left run length method is proposed to effectively compress the index block's repetitive pattern. Later, in Guo et al., "Non-RCE3: Modified Palette Mode for Screen Content Coding," JCT-VC of ITU-T SG 16 WP 3 and ISO/IEC JTC 1/SC 29/WG 11, JCTVC-N0249, 14th Meeting, Vienna, AT, 25 Jul.-2 Aug. 2013, the palette index coding mode was generalized to both copy from left and copy from above with run length coding. Note that no transformation process is invoked for palette coding to avoid blurring sharp edges, which may have negative impacts on visual quality of screen contents.

A palette is a data structure that stores (index, pixel value) pairs. The designed palette may be decided at the encoder, e.g., by a histogram of pixel values in a current block of video data, such as a current CU. For example, peak values in the histogram are added into the palette, while low frequency pixel values are not included into the palette. Palette size may be restricted to be in the range of 0 to max_palette_size, which may equal 31.

For SCC, CU blocks within one slice may share many dominant colors. Therefore, it is possible to predict a current block's palette using previous palette mode CUs' palettes (in CU decoding order) as reference. Specifically, a 0-1 binary vector may be signaled to indicate whether the pixel values in the reference palette is reused by the current palette or not. As an example, in Tables 1 and 2 below, it is assumed that the reference palette has 6 items. A vector (1, 0, 1, 1, 1, 1) is signaled with the current palette which indicates that v0, v2, v3, v4, and v5 are re-used in the current palette while v1 is not re-used. If the current palette contains colors which are not predictable from reference palette, the number of unpredicted colors is coded and then these colors are directly signaled. For example, in Tables 1 and 2, u0 and u1 are directly signaled into the bitstream.

TABLE 1

Reference Palette

| Index | Pixel Value |
|---|---|
| 0 | $V_0$ |
| 1 | $V_1$ |

TABLE 1-continued

Reference Palette

| Index | Pixel Value |
|---|---|
| 2 | $V_2$ |
| 3 | $V_3$ |
| 4 | $V_4$ |
| 5 | $V_5$ |

TABLE 2

Current Palette

| Prediction Flag | Index | Pixel Value |
|---|---|---|
| 1 | 0 | $V_0$ |
| 0 | | |
| 1 | 1 | $V_2$ |
| 1 | 2 | $V_3$ |
| 1 | 3 | $V_4$ |
| | 4 | $V_5$ |
| | 5 | $U_0$ |
| | 6 | $U_1$ |

For the block coded with the palette mode, the palette can be predicted from the palette entries of the previously palette coded blocks, can be explicitly signaled as a new entries or the palette of the previously coded block can be completely reused. The latter case is called palette sharing and a flag palette_share_flag is signaled to indicate that the entire palette of the previous block is reused without modification as is. Examples of a reference palette and a current palette are shown in Tables 1 and 2 above. In particular, Table 1 illustrates an example reference palette, and Table 2 illustrates an example current palette that can be predicted from the reference palette of Table 1.

In the current SCM3.0 reference software, the two primary aspects of palette coding from a normative perspective are the coding of the palette and coding of the palette index for each sample in the block being coded in the palette mode. The coding of palette indices is performed using two primary modes, 'index' mode and 'copy above' mode. This is signaled by coding a palette_mode flag. The 'index' mode is also used to indicate escape samples, i.e., samples that do not belong to the palette. In the current design, a 'copy above' mode is not possible for the first row of the palette block. In addition, a 'copy above' mode may not follow another 'copy above' mode. In these cases, an 'index' mode is inferred.

Specifically, for palette mode, pixels in the CU are encoded in a horizontal/vertical snake scan order as follows:
 1. "Index" mode: In this mode, one palette index is first signaled. If the index is equal to the size of the palette, this indicates that the sample is an escape sample. In this case, the sample value or quantized samples value for each component is signaled. For example, if the palette size is 4, for non-escape samples, the palette indices are in the range [0, 3]. In this case, an index value of 4 signifies an escape sample. If the index indicates a non-escape sample, run-length is signaled, which specifies the number of subsequent samples in scanning order that share the same index, by a non-negative value n−1 indicating the run length, which means that the following n pixels including the current one have the same pixel index as the first signaled one.
 2. "Copy from Above" run mode (CA): In this mode, only a non-negative run length value m−1 is transmitted to indicate that for the following m pixels including the current one, palette indexes are the same as their neighbors directly above, respectively. Note that this mode is different from "Index" mode, in the sense that the palette indices could be different within the Copy from Above run mode.

In the current design, the palette mode is signalled at a CU level, but it may be possible to signal it at a PU level. A flag, palette_esc_val_present_flag, is also signalled to indicate the presence of escape samples in a current block.

In the palette mode, the pixel scanning in the block can be of two types: vertical traverse or horizontal traverse (snake like) scanning. The scanning pattern used in the block is derived according to the flag palette_transpose_flag signaled per block unit.

During palette index coding, the palette index adjustment process can be applied. Starting from the second pixel in the block, it consists of checking the palette mode of the previously coded pixel. First, the palette size is reduced by 1, and if the left mode is equal to the Run mode, then the palette index to be coded is reduced by 1 if the index is greater than the left palette index, or if the left mode is Copy mode than the palette index to be coded is reduced by 1 if the index is greater than the above palette index. The description is provided from the encoding side, and the corresponding process can be performed in the reverse order at decoder side as well.

In SCM-3.0, the following syntax optimizations were adopted:

If palette size is 0, all escapes pixels are derived and no escape present flag, palette mode, palette index, palette run, and palette transpose flag is signaled, and the escape present flag is inferred to be equal to 1, the palette mode is inferred to be equal to the INDEX mode, palette index is set equal to the ESCAPE, palette run value is set equal to the block size, and the palette transpose flag is set to 0.

If palette size is 1 and no escape pixels are used in the block, then no palette mode, palette run, or palette transpose flag is signaled, and palette mode is derived to be equal to the INDEX mode, palette index is set to 0, palette run value is set equal to the block size, and the palette transpose flag is set to 0.

In SCM3.0, a truncated binary (TB) codeword is used to signal quantized escape pixels. This codeword may be referred to as a palette_escape_val syntax element. To use truncated binary, the total number of possible value is needed. For example, if truncated binary codeword is used to signify a set of N possible values {0, 1, 2, 3, . . . , N−1}, N is used to construct a truncated binary codeword (where N−1 is the maximum value). Equivalently, when the maximum value is known, N−1 in this example (assuming starting from 0), the corresponding truncated binary codeword can be constructed in the same manner. To get maximum quantized escape values, the following procedure is used in SCM3.0:

1. The quantization parameter qP is derived as follows:

$qP=(cIdx==0)?Qp'_Y:((cIdx==1)?Qp'_{Cb}:Qp'_{Cr})$

2. A quantization scaling factor quantScale, rightshift offset rightShiftOffset and rightshift parameter rightShiftParam are derived based on HEVC quantization lookup table as follows:

quantScale=g_quantScales[qP%6], where
  g_quantScales={26214,23302,20560,18396,
  16384,14564} rightShiftParam=14+$\lfloor qP/6 \rfloor$ rightShiftOffset=1<<(rightShiftParam−1)

3. A quantization step size parameter qStep is derived as follows:

$qStep=(qP==0)?Round(2^{(qP-4)/6}):1$

4. A maximum possible quantized value maxValue is derived as follows:

maxValue=((1<<bitDepth)−1)/Qstep

5. The number of bins numBins to represent maxValue is derived as follows

```
while( maxValue ) {
    maxValue = maxValue >> 1
    numBins++
}
```

6. The maximum parameter cMax for the truncated binary codeword is derived as follows $cMax=clip3(0,2^{numBins},((1<<bitDepth)-1)\times$
  quantScale+rightShiftOffset)>>rightShiftParam)

There are at least two potential problems with the current escape pixel design.

First, at the decoder side, the quantization scale factor, right shift offset and parameters are not available because these parameters are typical encoder parameters and are not standardized by the decoder. Different encoder can have different scale factor, right shift parameter and offset, and thus it may cause incorrect cMax calculations using inconsistent parameters between different encoder and decoder.

Second, the derivation of maxValue involves a division operation, which is not desirable for decoder. In particular, different decoders have different precision or interpretations for division operations, and thus may have different maxValue calculations in different decoder platforms. Therefore, inconsistent calculations of maxValue may cause encoder/decoder mismatch.

This disclosure describes various techniques that may offer solutions to these and other problems. Various techniques of this disclosure include removing the calculation using encoder dependent parameters and/or removing the division operations.

Additionally or alternatively, a new codeword may be designed that may be independent of the maximum value.

In one example, encoder-dependent parameters are not used to derive maximum quantized escape pixel value at the decoder. Instead, only the quantization step size is used in parameter derivation. Furthermore, addition and comparison are used instead of division operations during derivation of the maximum quantized escape pixel value. The following procedure is proposed to derive the maximum quantized escape pixel value:

1. The quantization parameter qP is derived based on color component. Different color components can have different quantization parameters. The following is an example to get $Qp'_Y$, $Qp'_{Cb}$ or $Qp'_{Cr}$, for component Y, Cb and Cr respectively, which may or may not be different.

$qP=(cIdx==0)?Qp'_Y:((cIdx==1)?Qp'_{Cb}:Qp'_{Cr})$ (1)

2. A quantization step size parameter qStep is derived using a formula with a quantization parameter qP as input. The following formula is an example where Round (.) is a rounding operator. Note that it is not limited to Round(.) only. Rather it can be replaced by other operators as well, for instance, floor operator $\lfloor . \rfloor$ or ceiling operator $\lceil . \rceil$:

$$qStep=(qP==0)?\text{Round}(2^{(qP-4)/6}):1 \quad (2)$$

3. A maximum possible quantized value cMax (initialized as 0) is derived given the maximum pixel value before quantization and qStep using a loop as follows (qStepTemp is initialized as qStep):

$$\text{while ( q StepTemp} <= ((\ 1<<\text{bitDepth}\ )-1\ )\ )\{ \quad (3)$$
$$\text{qStepTemp} += \text{qStep}$$
$$\text{cMax++}$$
$$\}$$

And then cMax is used to construct the truncated binary codeword to code the quantized escape pixels for the current coding unit. Note that all the quantized escape pixels are constrained in the range of [0, cMax] inclusive.

Alternatively, in Step 3, cMax (initialized as 1) can be derived using shift operations as follows with less accuracy:

$$\text{while ( qStep} <= ((\ 1<<\text{bitDepth}\ )-1\ )\ )\{ \quad (4)$$
$$\text{qStep}<<=1$$
$$\text{cMax}<<=1$$
$$\}$$
$$\text{cMax--}$$

In another example, encoder parameters (e.g., a quantization scale value (quantScale), a right shift offset value (rightShiftOffset), and a right shift parameter (rightShiftParam) value) may be used to derive maximum quantized escape value at the decoder. Thus, encoder related parameters may be stored in a lookup table at the decoder side. Furthermore, loop or shift operations may be used to derive the maximum number of bits to represent the quantized escape value. The following procedure may be used to derive the maximum quantized escape pixel value:

1. The quantization parameter qP is derived based on color component. Different color component can have different quantization parameters. The following is an example to get $Qp'_Y$, $Qp'_{Cb}$ or $Qp'_{Cr}$ for component Y, Cb and Cr respectively, which may or may not be different:

$$qP=(cIdx==0)?Qp'_Y:((cIdx==1)?Qp'_{Cb}:Qp'_{Cr})$$

2. A quantization scaling factor quantScale, a right shift offset rightShiftOffset and a right shift parameter rightShiftParam are derived based on a lookup table stored at the decoder for instance:

quantScale=g_quantScales[qP%6], where
   g_quantScales={26214, 23302,20560,18396,
   16384,14564 rightShiftParam=14+$\lfloor qP/6 \rfloor$ rightShiftOffset=1<<(rightShiftParam-1)

3. A quantization step size parameter qStep is derived using a formula with a quantization parameter qP as input. The following formula is an example to derive qStep, where Round (.) is a rounding operator. Note that it is not limited to Round(.) only. Rather it can be replaced by other operators as well, for instance, floor operator $\lfloor . \rfloor$ or ceiling operator $\lceil . \rceil$:

$$qStep=(qP==0)?\text{Round}(2^{(qP-4)/6}):1$$

4. A maximum possible quantized value maxValue (initialized as 0) is derived as follows (qStepTemp is initialized as qStep):

$$\text{while (qStepTemp} <= ((\ 1<<\text{bitDepth}\ )-1\ )\ )\{ \quad (5)$$
$$\text{qStepTemp} += \text{qStep}$$
$$\text{maxValue ++}$$
$$\}$$

5. The number of bins numBins to represent maxValue is derived as follows $$\text{while( maxValue ) } \{ \quad (6)$$
$$\text{maxValue} = \text{maxValue} >> 1$$
$$\text{numBins++}$$
$$\}$$

6. The maximum parameter cMax for the truncated binary codeword is derived as follows $$c\text{Max}=\text{clip3}(0,2^{numBins},((1<<\text{bitDepth})-1)\times$$
$$\text{quantScale+rightShiftOffset})>>\text{rightShiftParam}) \quad (7)$$

Note that in the case, the quantized escape pixel is constrained to be within the range of [0, cMax] inclusive.

In another example, encoder parameters may be used to derive a maximum quantized escape value, without performing clipping and/or division operations. Thus encoder-related parameters need to be stored in a lookup table at the decoder side. The following procedure may be used to derive the maximum quantized escape pixel value:

1. The quantization parameter qP is derived based on color component. Different color component can have different quantization parameters. The following is an example to get $Qp'_Y$, $Qp'_{Cb}$ or $Qp'_{Cr}$ for component Y, Cb and Cr respectively, which may or may not be different:

$$qP=(cIdx==0)?Qp'_Y:((cIdx==1)?Qp'_{Cb}:Qp'_{Cr})$$

2. A quantization scaling factor quantScale, a right shift offset rightShiftOffset and a right shift parameter rightShiftParam are derived based on a lookup table stored at the decoder, for instance:

quantScale=g_quantScales[qP%6], where
   g_quantScales={26214, 23302,20560,18396,
   16384,14564} rightShiftParam=14+$\lfloor qP/6 \rfloor$ rightShiftOffset=1<<(rightShiftParam-1)

3. The maximum parameter cMax for the truncated binary codeword is derived as follows $$c\text{Max}=((1<<\text{bitDepth})-1)\times\text{quantScale+rightShiftOff-}$$
$$\text{set})>>\text{rightShiftParam} \quad (8)$$

Note that in the case, the quantized escape pixel is constraint in the range of [0, cMax] inclusive.

In another example, the maximum quantized escape pixel value may be derived using a quantization parameter qP and a color component bitDepth, along with a look-up up table. Specifically, cMax can be obtained using a loop up table with qP and bitDepth. The following is an example of cMax derivation 1. The quantization parameter qP is derived based on color component. Different color component can have different quantization parameters. The following is an example to get $Qp'_Y$, $Qp'_{Cb}$ or $Qp'_{Cr}$ for component Y, Cb and Cr respectively, which may or may not be different:

$$qP=(cIdx==0)?Qp'_Y:((cIdx==1)?Qp'_{Cb}:Qp'_{Cr})$$

2. A base quantization parameter baseQp is derived with given bitDepth:

$$baseQp=qP-6*(bitDepth-8)$$

3. If baseQp is equal or larger than 0, cMax can be found through lookup table given baseQp as input entry
4. Otherwise, (baseQp is negative), and cMax can be derived as follows:

$$cMax=Table[qP]>>(bitDepth-8) \qquad (9)$$

TABLE 3

An example of a cMax lookup table

| qP | 0 | 1 | 2 | 3 | 4 | 5 | 6 | 7 |
|---|---|---|---|---|---|---|---|---|
| cMax | 405 | 361 | 321 | 286 | 255 | 227 | 202 | 180 |
| qP | 8 | 9 | 10 | 11 | 12 | 13 | 14 | 15 |
| cMax | 161 | 143 | 128 | 114 | 101 | 90 | 80 | 72 |
| qP | 16 | 17 | 18 | 19 | 20 | 21 | 22 | 23 |
| cMax | 64 | 57 | 51 | 45 | 40 | 36 | 32 | 28 |
| qP | 24 | 25 | 26 | 27 | 28 | 29 | 30 | |
| cMax | 25 | 23 | 20 | 18 | 16 | 14 | 13 | |
| qP | 31 | 32 | 32 | 34 | 35 | 36 | 37 | |
| cMax | 11 | 10 | 9 | 8 | 7 | 6 | 6 | |
| qP | 38 | 39 | 40 | 41 | 42 | 43 | 44 | |
| cMax | 5 | 4 | 4 | 4 | 3 | 3 | 3 | |
| qP | 45 | 46 | 47 | 48 | 49 | 50 | 51 | |
| cMax | 2 | 2 | 2 | 2 | 1 | 1 | 1 | |

TABLE 4

Another example of a cMax lookup table

| qP | 0 | 1 | 2 | 3 | 4 | 5 | 6 | 7 |
|---|---|---|---|---|---|---|---|---|
| cMax | 255 | 255 | 255 | 255 | 255 | 227 | 202 | 180 |
| qP | 8 | 9 | 10 | 11 | 12 | 13 | 14 | 15 |
| cMax | 161 | 143 | 128 | 114 | 101 | 90 | 80 | 72 |
| qP | 16 | 17 | 18 | 19 | 20 | 21 | 22 | 23 |
| cMax | 64 | 57 | 51 | 45 | 40 | 36 | 32 | 28 |
| qP | 24 | 25 | 26 | 27 | 28 | 29 | 30 | |
| cMax | 25 | 23 | 20 | 18 | 16 | 14 | 13 | |
| qP | 31 | 32 | 32 | 34 | 35 | 36 | 37 | |
| cMax | 11 | 10 | 9 | 8 | 7 | 6 | 6 | |
| qP | 38 | 39 | 40 | 41 | 42 | 43 | 44 | |
| cMax | 5 | 4 | 4 | 4 | 3 | 3 | 3 | |
| qP | 45 | 46 | 47 | 48 | 49 | 50 | 51 | |
| cMax | 2 | 2 | 2 | 2 | 1 | 1 | 1 | |

In some examples, a coding system, such as an encoder or a decoder, may derive the maximum value using an equation based formula based on bitdepth and quantization parameters, either jointly or separately depending on the example. The following procedure is one example to jointly consider the bitdepth and quantization parameter:

The quantization parameter qP is derived based on color component. Different color component can have different quantization parameters. The following is an example to get $Qp'_Y$, $Qp'_{Cb}$ or $Qp'_{Cr}$ for component Y, Cb and Cr respectively, which may or may not be different:

$$qP=(cIdx==0)?Qp'_Y:((cIdx==1)?Qp'_{Cb}:Qp'_{Cr})$$

A quantization base parameter qPBase is predefined at both the encoder and decoder, or signaled in different levels, such as SPS, PPS, slice levels etc; or adaptively derived based on each qP values and bitdepth jointly or separately. The following is an example to use a fixed number for qPBase:

$$qPBase=4 \qquad (10)$$

A quantization bit reduction factor quantBits is derived using an equation or based on a lookup table stored at both the encoder and decoder as follows. Note that the operation invoked herein is not limited to the floor operation $\lfloor . \rfloor$ as shown in the following equation. The ceiling operation $\lceil . \rceil$ can be used instead of the floor operation.

$$quantBits=(qP-qPBase)>0?\lfloor(qP-qPBase)6\rfloor:0 \qquad (11)$$

A maximum bit parameter maxBit may be derived based on bitdepth and quantBits, and the following is an example:

$$maxBit=bitDepth-quantBits \qquad (12)$$

The maximum parameter cMax for the truncated binary codeword (or other codeword which requires calculation of a possible maximum value, for instance, fixed length codeword) is derived as follows $$cMax=(1<<maxBit)-1 \qquad (13)$$

Note that in the case, the quantized escape pixel is constrained in the range of [0, cMax] inclusive.

Also note that the examples above deal with the case when the current palette mode is operating in lossy mode. When the current palette mode is operating in lossless mode, the maximum parameter cMax may be kept unchanged, as in the current SCM3.0 in the form of $cMax=((1<<bitDepth)-1)$.

Furthermore, the various examples discussed above apply to a variable length codeword. If a fixed length codeword is used to code quantized escape pixels, a similar procedure as in the examples above can be used to derive the maximum quantized escape pixel value. And then a loop may be used to determine the number of bits to present the maximum quantized escape pixel value.

This disclosure also describes techniques that may be used to design a codeword independent of a maximum value constraint. These techniques may be used alone or in combination with the various examples discussed above. In particular, a codeword without a maximum value constraint may be used during quantized escape pixel coding. In one example, a concatenation of Golomb rice and exponential Golomb codeword is used to code the quantized escape pixels. Alternatively, unary code, or Golomb family codewords or their combinations can also be applied herein during coding the quantized escape pixels. For example, an encoder or a decoder may use Golomb rice with rice parameter K, and/or exponential Golomb with parameter L, where K, and L can be any integer number, 0, 1, 2, 3 . . . . The values of the parameters (L, K) may be dependent on the bit depth. The quantized escape pixel may be constrained to 15 bits precision (plus sign) for 8 bit input signal, while the precision may be kept as max(15, bitDepth+6). For example, Golomb rice coding may be used to code a first portion of an escape pixel value, and exponential Golomb with parameter 3 may be used to code a second portion of the escape pixel value.

In exponential Golomb coding with parameter L coding, a value to be coded is divided by $2^L$. The result of this division is coded using an order-0 exponential Golomb codeword, and the remainder (i.e., the value modulo $2^L$) is coded in binary. Thus, the parameter L impacts a number of bits included in the remainder. It should be understood that the same value, when coded using different values for parameter L, may result in exponential Golomb codewords having different lengths. Furthermore, in some cases, a larger value for parameter L may result in a shorter codeword for a value to be coded than a smaller value for parameter L for the same value to be coded.

Although described as being independent of a maximum value constraint, the techniques for coding the escape pixel value using a combination of Golomb rice and exponential Golomb with parameter 3 may be used in combination with any of the other techniques discussed above for determining a maximum quantized escape pixel value. For example, the escape pixel value may still be truncated (e.g., one bit may be removed). As one example, the second portion of the escape pixel value (that is, the portion coded using exponential Golomb with parameter 3 as discussed above) may be truncated based on a determined maximum quantized escape pixel value, as discussed above.

This disclosure describes a method of deriving a maximum quantized escape pixel value. According to the techniques of this disclosure, a video encoder and/or video decoder may determine a block indicative of a plurality of pixels; determine a maximum quantized escape pixel value based at least in part on a quantization parameter; and code the block using the maximum quantized escape pixel value.

For instance, techniques of this disclosure may not use encoder dependent parameters to derive maximum quantized escape pixel value at the decoder. Instead, techniques of this disclosure may only use the quantization step size in parameter derivation. Furthermore, in some examples, techniques of this disclosure may use addition and comparison instead of division operations during deriving the maximum quantized escape pixel value.

As another example, techniques of this disclosure may use encoder parameters to derive maximum quantized escape value at the decoder. Thus, techniques of this disclosure may store encoder related parameters in a lookup table at the decoder side. Furthermore, techniques of this disclosure may use loop or shift operations to derive the maximum number of bits to represent the quantized escape value.

In some examples, techniques of this disclosure may use encoder parameters to derive maximum quantized escape value without clipping and division operations. Thus, techniques of this disclosure may store encoder related parameters in a lookup table at the decoder side. As further described in this disclosure, in some examples, techniques of this disclosure may derive the maximum quantized escape pixel value using a quantization parameter qP and color component bitDepth. Specifically, techniques of this disclosure may obtain a cMax value using a loop up table with qP and bitDepth.

FIG. 1 is a block diagram illustrating an example video coding system 10 that may utilize the techniques of this disclosure. As used herein, the term "video coder" refers generically to both video encoders and video decoders. In this disclosure, the terms "video coding" or "coding" may refer generically to video encoding or video decoding. Video encoder 20 and video decoder 30 of video coding system 10 represent examples of devices that may be configured to perform techniques for palette-based video coding in accordance with various examples described in this disclosure. For example, video encoder 20 and video decoder 30 may be configured to selectively code various blocks of video data, such as CUs or PUs in HEVC coding, using either palette-based coding or non-palette based coding. Non-palette based coding modes may refer to various inter-predictive temporal coding modes or intra-predictive spatial coding modes, such as the various coding modes specified by HEVC Draft 10.

As shown in FIG. 1, video coding system 10 includes a source device 12 and a destination device 14. Source device 12 generates encoded video data. Accordingly, source device 12 may be referred to as a video encoding device or a video encoding apparatus. Destination device 14 may decode the encoded video data generated by source device 12. Accordingly, destination device 14 may be referred to as a video decoding device or a video decoding apparatus. Source device 12 and destination device 14 may be examples of video coding devices or video coding apparatuses.

Source device 12 and destination device 14 may comprise a wide range of devices, including desktop computers, mobile computing devices, notebook (e.g., laptop) computers, tablet computers, set-top boxes, telephone handsets such as so-called "smart" phones, televisions, cameras, display devices, digital media players, video gaming consoles, in-car computers, or the like.

Destination device 14 may receive encoded video data from source device 12 via a channel 16. Channel 16 may comprise one or more media or devices capable of moving the encoded video data from source device 12 to destination device 14. In one example, channel 16 may comprise one or more communication media that enable source device 12 to transmit encoded video data directly to destination device 14 in real-time. In this example, source device 12 may modulate the encoded video data according to a communication standard, such as a wireless communication protocol, and may transmit the modulated video data to destination device 14. The one or more communication media may include wireless and/or wired communication media, such as a radio frequency (RF) spectrum or one or more physical transmission lines. The one or more communication media may form part of a packet-based network, such as a local area network, a wide-area network, or a global network (e.g., the Internet). The one or more communication media may include routers, switches, base stations, or other equipment that facilitate communication from source device 12 to destination device 14.

In another example, channel 16 may include a storage medium that stores encoded video data generated by source device 12. In this example, destination device 14 may access the storage medium via disk access or card access. The storage medium may include a variety of locally-accessed data storage media such as Blu-ray discs, DVDs, CD-ROMs, flash memory, or other suitable digital storage media for storing encoded video data.

In a further example, channel 16 may include a file server or another intermediate storage device that stores encoded video data generated by source device 12. In this example, destination device 14 may access encoded video data stored at the file server or other intermediate storage device via streaming or download. The file server may be a type of server capable of storing encoded video data and transmitting the encoded video data to destination device 14. Example file servers include web servers (e.g., for a website), file transfer protocol (FTP) servers, network attached storage (NAS) devices, and local disk drives.

Destination device 14 may access the encoded video data through a standard data connection, such as an Internet connection. Example types of data connections may include wireless channels (e.g., Wi-Fi connections), wired connections (e.g., DSL, cable modem, etc.), or combinations of both that are suitable for accessing encoded video data stored on a file server. The transmission of encoded video data from the file server may be a streaming transmission, a download transmission, or a combination of both.

The techniques of this disclosure are not limited to wireless applications or settings. The techniques may be applied to video coding in support of a variety of multimedia applications, such as over-the-air television broadcasts, cable television transmissions, satellite television transmissions, streaming video transmissions, e.g., via the Internet, encoding of video data for storage on a data storage medium, decoding of video data stored on a data storage medium, or other applications. In some examples, video coding system 10 may be configured to support one-way or two-way video transmission to support applications such as video streaming, video playback, video broadcasting, and/or video telephony.

Video coding system 10 illustrated in FIG. 1 is merely an example and the techniques of this disclosure may apply to video coding settings (e.g., video encoding or video decoding) that do not necessarily include any data communication between the encoding and decoding devices. In other examples, data is retrieved from a local memory, streamed over a network, or the like. A video encoding device may encode and store data to memory, and/or a video decoding device may retrieve and decode data from memory. In many examples, the encoding and decoding is performed by devices that do not communicate with one another, but simply encode data to memory and/or retrieve and decode data from memory.

In the example of FIG. 1, source device 12 includes a video source 18, a video encoder 20, and an output interface 22. In some examples, output interface 22 may include a modulator/demodulator (modem) and/or a transmitter. Video source 18 may include a video capture device, e.g., a video camera, a video archive containing previously-captured video data, a video feed interface to receive video data from a video content provider, and/or a computer graphics system for generating video data, or a combination of such sources of video data.

Video encoder 20 may encode video data from video source 18. In some examples, source device 12 directly transmits the encoded video data to destination device 14 via output interface 22. In other examples, the encoded video data may also be stored onto a storage medium or a file server for later access by destination device 14 for decoding and/or playback.

In the example of FIG. 1, destination device 14 includes an input interface 28, a video decoder 30, and a display device 32. In some examples, input interface 28 includes a receiver and/or a modem. Input interface 28 may receive encoded video data over channel 16. Display device 32 may be integrated with or may be external to destination device 14. In general, display device 32 displays decoded video data. Display device 32 may comprise a variety of display devices, such as a liquid crystal display (LCD), a plasma display, an organic light emitting diode (OLED) display, or another type of display device.

This disclosure may generally refer to video encoder 20 "signaling" or "transmitting" certain information to another device, such as video decoder 30. The term "signaling" or "transmitting" may generally refer to the communication of syntax elements and/or other data used to decode the compressed video data. Such communication may occur in real- or near-real-time. Alternately, such communication may occur over a span of time, such as might occur when storing syntax elements to a computer-readable storage medium in an encoded bitstream at the time of encoding, which then may be retrieved by a decoding device at any time after being stored to this medium. Thus, while video decoder 30 may be referred to as "receiving" certain information, the receiving of information does not necessarily occur in real- or near-real-time and may be retrieved from a medium at some time after storage.

Video encoder 20 and video decoder 30 each may be implemented as any of a variety of suitable circuitry, such as one or more microprocessors, digital signal processors (DSPs), application-specific integrated circuits (ASICs), field-programmable gate arrays (FPGAs), discrete logic, hardware, or any combinations thereof. If the techniques are implemented partially in software, a device may store instructions for the software in a suitable, non-transitory computer-readable storage medium and may execute the instructions in hardware using one or more processors to perform the techniques of this disclosure. Any of the foregoing (including hardware, software, a combination of hardware and software, etc.) may be considered to be one or more processors. Each of video encoder 20 and video decoder 30 may be included in one or more encoders or decoders, either of which may be integrated as part of a combined encoder/decoder (CODEC) in a respective device.

In some examples, video encoder 20 and video decoder 30 operate according to a video compression standard, such as HEVC standard mentioned above, and described in HEVC Draft 10. In addition to the base HEVC standard, there are ongoing efforts to produce scalable video coding, multiview video coding, and 3D coding extensions for HEVC. In addition, palette-based coding modes, e.g., as described in this disclosure, may be provided for extension of the HEVC standard. In some examples, the techniques described in this disclosure for palette-based coding may be applied to encoders and decoders configured to operation according to other video coding standards, such as the ITU-T-H.264/AVC standard or future standards. Accordingly, application of a palette-based coding mode for coding of coding units (CUs) or prediction units (PUs) in an HEVC codec is described for purposes of example.

In HEVC and other video coding standards, a video sequence typically includes a series of pictures. Pictures may also be referred to as "frames." A picture may include three sample arrays, denoted $S_L$, $S_{Cb}$, and $S_{Cr}$. $S_L$ is a two-dimensional array (i.e., a block) of luma samples. $S_{Cb}$ is a two-dimensional array of Cb chrominance samples. $S_{Cr}$ is a two-dimensional array of Cr chrominance samples. Chrominance samples may also be referred to herein as "chroma" samples. In other instances, a picture may be monochrome and may only include an array of luma samples.

To generate an encoded representation of a picture, video encoder 20 may generate a set of coding tree units (CTUs). Each of the CTUs may be a coding tree block of luma samples, two corresponding coding tree blocks of chroma samples, and syntax structures used to code the samples of the coding tree blocks. A coding tree block may be an N×N block of samples. A CTU may also be referred to as a "tree block" or a "largest coding unit" (LCU). The CTUs of HEVC may be broadly analogous to the macroblocks of other standards, such as H.264/AVC. However, a CTU is not necessarily limited to a particular size and may include one or more coding units (CUs). A slice may include an integer number of CTUs ordered consecutively in the raster scan. A coded slice may comprise a slice header and slice data. The slice header of a slice may be a syntax structure that includes syntax elements that provide information about the slice. The slice data may include coded CTUs of the slice.

This disclosure may use the term "video unit" or "video block" or "block" to refer to one or more sample blocks and syntax structures used to code samples of the one or more blocks of samples. Example types of video units or blocks may include CTUs, CUs, PUs, transform units (TUs), macroblocks, macroblock partitions, and so on. In some contexts, discussion of PUs may be interchanged with discussion of macroblocks or macroblock partitions.

To generate a coded CTU, video encoder 20 may recursively perform quad-tree partitioning on the coding tree blocks of a CTU to divide the coding tree blocks into coding blocks, hence the name "coding tree units." A coding block is an N×N block of samples. A CU may be a coding block of luma samples and two corresponding coding blocks of chroma samples of a picture that has a luma sample array, a Cb sample array and a Cr sample array, and syntax structures used to code the samples of the coding blocks. Video encoder 20 may partition a coding block of a CU into one or more prediction blocks. A prediction block may be a rectangular (i.e., square or non-square) block of samples on which the same prediction is applied. A prediction unit (PU) of a CU may be a prediction block of luma samples, two corresponding prediction blocks of chroma samples of a picture, and syntax structures used to predict the prediction block samples. Video encoder 20 may generate predictive luma, Cb and Cr blocks for luma, Cb and Cr prediction blocks of each PU of the CU.

Video encoder 20 may use intra prediction or inter prediction to generate the predictive blocks for a PU. If video encoder 20 uses intra prediction to generate the predictive blocks of a PU, video encoder 20 may generate the predictive blocks of the PU based on decoded samples of the picture associated with the PU.

If video encoder 20 uses inter prediction to generate the predictive blocks of a PU, video encoder 20 may generate the predictive blocks of the PU based on decoded samples of one or more pictures other than the picture associated with the PU. Video encoder 20 may use uni-prediction or bi-prediction to generate the predictive blocks of a PU. When video encoder 20 uses uni-prediction to generate the predictive blocks for a PU, the PU may have a single motion vector (MV). When video encoder 20 uses bi-prediction to generate the predictive blocks for a PU, the PU may have two MVs.

After video encoder 20 generates predictive blocks (e.g., predictive luma, Cb and Cr blocks) for one or more PUs of a CU, video encoder 20 may generate residual blocks for the CU. Each sample in a residual block of the CU may indicate a difference between a sample in a predictive block of a PU of the CU and a corresponding sample in a coding block of the CU. For example, video encoder 20 may generate a luma residual block for the CU. Each sample in the CU's luma residual block indicates a difference between a luma sample in one of the CU's predictive luma blocks and a corresponding sample in the CU's original luma coding block. In addition, video encoder 20 may generate a Cb residual block for the CU. Each sample in the CU's Cb residual block may indicate a difference between a Cb sample in one of the CU's predictive Cb blocks and a corresponding sample in the CU's original Cb coding block. Video encoder 20 may also generate a Cr residual block for the CU. Each sample in the CU's Cr residual block may indicate a difference between a Cr sample in one of the CU's predictive Cr blocks and a corresponding sample in the CU's original Cr coding block.

Furthermore, video encoder 20 may use quad-tree partitioning to decompose the residual blocks (e.g., luma, Cb and Cr residual blocks) of a CU into one or more transform blocks (e.g., luma, Cb and Cr transform blocks). A transform block may be a rectangular block of samples on which the same transform is applied. A transform unit (TU) of a CU may be a transform block of luma samples, two corresponding transform blocks of chroma samples, and syntax structures used to transform the transform block samples. Thus, each TU of a CU may be associated with a luma transform block, a Cb transform block, and a Cr transform block. The luma transform block associated with the TU may be a sub-block of the CU's luma residual block. The Cb transform block may be a sub-block of the CU's Cb residual block. The Cr transform block may be a sub-block of the CU's Cr residual block.

Video encoder 20 may apply one or more transforms to a transform block to generate a coefficient block for a TU. A coefficient block may be a two-dimensional array of transform coefficients. A transform coefficient may be a scalar quantity. For example, video encoder 20 may apply one or more transforms to a luma transform block of a TU to generate a luma coefficient block for the TU. Video encoder 20 may apply one or more transforms to a Cb transform block of a TU to generate a Cb coefficient block for the TU. Video encoder 20 may apply one or more transforms to a Cr transform block of a TU to generate a Cr coefficient block for the TU.

After generating a coefficient block (e.g., a luma coefficient block, a Cb coefficient block or a Cr coefficient block), video encoder 20 may quantize the coefficient block. Quantization generally refers to a process in which transform coefficients are quantized to possibly reduce the amount of data used to represent the transform coefficients, providing further compression. After video encoder 20 quantizes a coefficient block, video encoder 20 may entropy encode syntax elements indicating the quantized transform coefficients. For example, video encoder 20 may perform Context-Adaptive Binary Arithmetic Coding (CABAC) on the syntax elements indicating the quantized transform coefficients. Video encoder 20 may output the entropy-encoded syntax elements in a bitstream. The bitstream may also include syntax elements that are not entropy encoded.

Video encoder 20 may output a bitstream that includes the entropy-encoded syntax elements. The bitstream may include a sequence of bits that forms a representation of coded pictures and associated data. The bitstream may comprise a sequence of network abstraction layer (NAL) units. Each of the NAL units includes a NAL unit header and encapsulates a raw byte sequence payload (RBSP). The NAL unit header may include a syntax element that indicates a NAL unit type code. The NAL unit type code specified by the NAL unit header of a NAL unit indicates the type of the NAL unit. A RBSP may be a syntax structure containing an integer number of bytes that is encapsulated within a NAL unit. In some instances, an RBSP includes zero bits.

Different types of NAL units may encapsulate different types of RBSPs. For example, a first type of NAL unit may encapsulate an RBSP for a picture parameter set (PPS), a second type of NAL unit may encapsulate an RBSP for a coded slice, a third type of NAL unit may encapsulate an RBSP for supplemental enhancement information (SEI), and so on. NAL units that encapsulate RBSPs for video coding data (as opposed to RBSPs for parameter sets and SEI messages) may be referred to as video coding layer (VCL) NAL units.

Video decoder 30 may receive a bitstream generated by video encoder 20. In addition, video decoder 30 may obtain syntax elements from the bitstream. For example, video decoder 30 may parse the bitstream to decode syntax elements from the bitstream. Video decoder 30 may reconstruct the pictures of the video data based at least in part on the syntax elements obtained (e.g., decoded) from the bitstream. The process to reconstruct the video data may be generally reciprocal to the process performed by video encoder 20. For instance, video decoder 30 may use MVs of PUs to determine predictive sample blocks (i.e., predictive blocks) for the PUs of a current CU. In addition, video decoder 30 may inverse quantize transform coefficient blocks associated with TUs of the current CU. Video decoder 30 may perform inverse transforms on the transform coefficient blocks to reconstruct transform blocks associated with the TUs of the current CU. Video decoder 30 may reconstruct the coding blocks of the current CU by adding the samples of the predictive sample blocks for PUs of the current CU to corresponding samples of the transform blocks of the TUs of the current CU. By reconstructing the coding blocks for each CU of a picture, video decoder 30 may reconstruct the picture.

In some examples, video encoder 20 and video decoder 30 may be configured to perform palette-based coding. For example, in palette based coding, rather than performing the intra-predictive or inter-predictive coding techniques described above, video encoder 20 and video decoder 30 may code a so-called palette as a table of colors or pixel values representing the video data of a particular area (e.g., a given block). In this way, rather than coding actual pixel values or their residuals for a current block of video data, the video coder may code index values for one or more of the pixels values of the current block, where the index values indicate entries in the palette that are used to represent the pixel values of the current block.

For example, video encoder 20 may encode a block of video data by determining a palette for the block, locating an entry in the palette having a value representative of the value of one or more individual pixels of the block, and encoding the block with index values that indicate the entry in the palette used to represent the one or more individual pixel values of the block. Additionally, video encoder 20 may signal the index values in an encoded bitstream. In turn, a video decoding device (e.g., video decoder 30) may obtain, from the encoded bitstream, the palette for a block, as well as index values used for determining the various individual pixels of the block using the palette. Video decoder 30 may match the index values of the individual pixels to entries of the palette to reconstruct the pixel values of the block. In instances where the index value associated with an individual pixel does not match any index value of the corresponding palette for the block, video decoder 30 may identify such a pixel as an escape pixel, for the purposes of palette-based coding.

In another example, video encoder 20 may encode a block of video data according to the following operations. Video encoder 20 may determine prediction residual values for individual pixels of the block, determine a palette for the block, and locate an entry (e.g., index value) in the palette having a value representative of the value of one or more of the prediction residual values of the individual pixels. Additionally, video encoder 20 may encode pixels of the block with index values that indicate the entry in the palette used to represent the corresponding prediction residual value for each individual pixel of the block. Video decoder 30 may obtain, from an encoded bitstream signaled by source device 12, a palette for a block, as well as index values for the prediction residual values corresponding to the individual pixels of the block. As described, the index values may correspond to entries in the palette associated with the current block. In turn, video decoder 30 may relate the index values of the prediction residual values to entries of the palette to reconstruct the prediction residual values of the block. The prediction residual values may be added to the prediction values (for example, obtained using intra or inter prediction) to reconstruct the pixel values of the block.

As described in more detail below, the basic idea of palette-based coding is that, for a block of video data to be coded, video encoder 20 may derive a palette that includes the most dominant pixel values in the block. For instance, the palette may refer to a number of pixel values which are determined or assumed to be dominant and/or representative for the current CU. Video encoder 20 may encode data representative of the size and the elements of the palette. Additionally, video encoder 20 may encode the pixel values in the block according to a certain scanning order. For each pixel included in the block, video encoder 20 may determine whether the value of the pixel is included in the palette. If the pixel is included in the palette, video encoder 20 may signal the index value that maps the pixel value to a corresponding entry in the palette. Additionally, video encoder 20 may signal a "run" value indicating how many pixels following the pixel for which the index was signaled have the same value. As an alternative, if a series of pixels have values that are the same as values from neighboring pixels above, video encoder 20 may encode the pixels using a "copy-from-above" mode, in which a run value (but no index value) indicates a number of pixels that share values with pixels from above.

On the other hand, if the value of a current pixel of the block is not included in the palette (i.e., no palette entry exists that specifies a particular pixel value of the palette-coded block), and the pixel does not share a value with an above-neighboring pixel, then such a pixel may be defined as an "escape pixel." In accordance with palette-based coding, video encoder 20 may encode and signal an index value that is reserved for an escape pixel. For example, the index value representing an escape pixel may be the size of the palette, assuming the palette is zero-indexed. That is, for a palette having four entries indexed zero to three, video encoder 20 may signal a value of four (4) for a pixel to indicate that the pixel is encoded as an escape pixel. In some examples, video encoder 20 may also encode and signal the pixel value or a residual value (or quantized versions thereof) for an escape pixel included in the block.

In accordance with the techniques of this disclosure, video encoder 20 may encode the value of an escape pixel in two parts, a first portion and a second portion. The first and second portions, when concatenated, may represent the value of the escape pixel. Video encoder 20 may encode the first portion using a Golomb rice codeword and the second portion using an exponential Golomb with parameter 3 codeword.

Upon receiving the encoded video bitstream signaled by video encoder 20, video decoder 30 may first determine the palette based on the information received from video encoder 20. Video decoder 30 may then map the received index values associated with the pixel locations in the given block to entries of the palette to reconstruct the pixel values of the given block. In some instances, video decoder 30 may determine that a pixel of a palette-coded block is an escape pixel, such as by determining that the pixel is palette-coded with an index value reserved for escape pixels. In instances where video decoder 30 identifies an escape pixel in a palette-coded block, video decoder 30 may receive the pixel value or a residual value (or quantized versions thereof) for an escape pixel included in the given block. Video decoder 30 may reconstruct the palette-coded block by mapping the individual pixel values to the corresponding palette entries, and by using the pixel value or residual value (or quantized versions thereof) to reconstruct any escape pixels included in the palette-coded block.

Video encoder 20 and/video decoder 30 may be configured to operate according to the techniques described in this disclosure to derive a maximum quantized escape pixel value. For instance, video encoder 20 and/video decoder 30 may determine a block indicative of a plurality of pixels; determine a maximum quantized escape pixel value based at least in part on a quantization parameter and code the block using the maximum quantized escape pixel value.

In some examples, determining the maximum quantized escape pixel value further comprises: determining the quantization parameter based on a color component; determining a quantization step size based on the quantization parameter; determining a maximum possible quantized value based on the quantization step size; and generating a truncated binary codeword to code the quantized escape pixels, based on the maximum quantized escape pixel value. In some examples, the maximum quantized escape pixel value is determined using only the quantization step. In some examples, determining the maximum quantized escape pixel value is not based on an encoder dependent parameter.

In some examples, techniques of this disclosure include determining the maximum quantized escape pixel value is performed without using division operations. In some examples, determining the maximum quantized escape pixel value is performed using addition and comparison. In some examples, determining the maximum quantized escape pixel value further comprises: determining a quantization parameter based on a color component; determining, based on the quantization parameter, at least one of a quantization scaling factor or shift parameter; determining a maximum possible quantized value based on at least one of a quantization scaling factor or shift parameter; and generating a truncated binary codeword to code the quantized escape pixels, based on the maximum quantized escape pixel value.

In some examples, techniques of this disclosure include determining a quantization step size parameter based on the quantization parameter; and wherein the maximum possible quantized value is further determined based on the quantization step size. In some examples, the at least one of the quantization scaling factor or shift parameter is an encoder parameter. In some examples, techniques of this disclosure include storing the at least one of the quantization scaling factor or shift parameter in a lookup table; and wherein determining, based on the quantization parameter, the at least one of the quantization scaling factor or shift parameter further comprises performing a lookup in the lookup table to determine the at least one of the quantization scaling factor or the shift parameter.

In some examples, determining the maximum quantized escape pixel value further includes determining a quantization parameter based on a color component; determining a base quantization parameter based on a bit depth; determining whether the base quantization parameter satisfies a threshold; and when the base quantization parameter satisfies the threshold, determining a maximum possible quantized value from a lookup table and based on the base quantization parameter, and when the base quantization parameter does not satisfy the threshold, determining a maximum possible quantized value from a lookup table and based on the bit depth.

In some examples, the quantized escape pixels are coded in a fixed length codeword. In some examples, a codeword that includes the maximum quantized escape pixel value is generated without a maximum value constraint. In some examples, the maximum quantized escape pixel value is determined at least without performing a division operation or without using an encoder dependent parameter.

Figure 2:
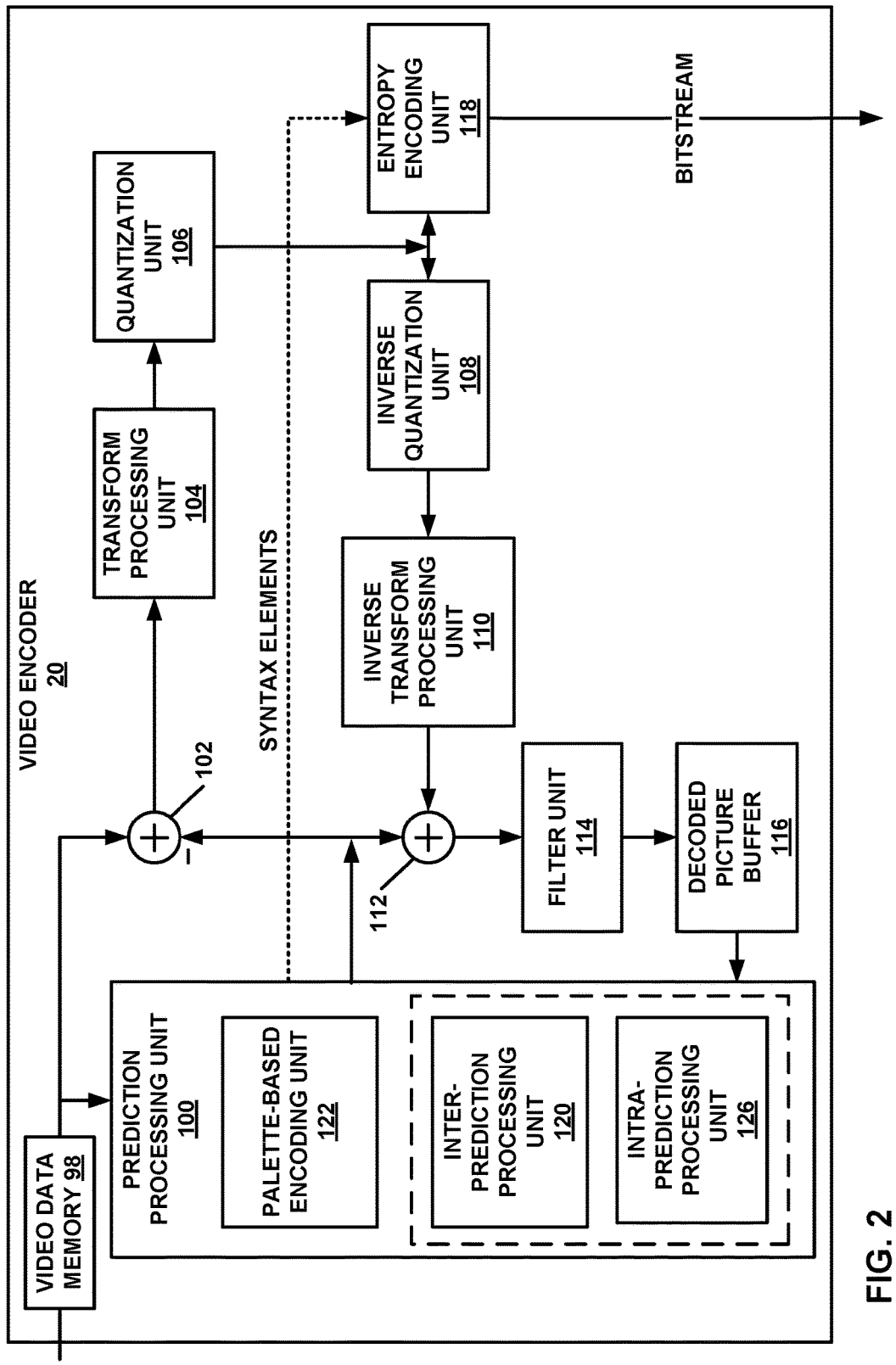
FIG. 2 is a block diagram illustrating an example video encoder that may implement the techniques described in this disclosure.

FIG. 2 is a block diagram illustrating an example video encoder 20 that may implement various techniques of this disclosure. FIG. 2 is provided for purposes of explanation and should not be considered limiting of the techniques as broadly exemplified and described in this disclosure. For purposes of explanation, this disclosure describes video encoder 20 in the context of HEVC coding. However, the techniques of this disclosure may be applicable to other coding standards or methods.

In the example of FIG. 2, video encoder 20 includes a video data memory 98, a prediction processing unit 100, a residual generation unit 102, a transform processing unit 104, a quantization unit 106, an inverse quantization unit 108, an inverse transform processing unit 110, a reconstruction unit 112, a filter unit 114, a decoded picture buffer 116, and an entropy encoding unit 118. Prediction processing unit 100 includes an inter-prediction processing unit 120 and an intra-prediction processing unit 126. Inter-prediction processing unit 120 includes a motion estimation unit and a motion compensation unit (not shown). Video encoder 20 also includes a palette-based encoding unit 122 configured to perform various aspects of the palette-based coding techniques described in this disclosure. In other examples, video encoder 20 may include more, fewer, or different functional components.

Video data memory 98 may store video data to be encoded by the components of video encoder 20. The video data stored in video data memory 98 may be obtained, for example, from video source 18. Decoded picture buffer 116 may be a reference picture memory that stores reference video data for use in encoding video data by video encoder 20, e.g., in intra- or inter-coding modes. Video data memory 98 and decoded picture buffer 116 may be formed by any of a variety of memory devices, such as dynamic random access memory (DRAM), including synchronous DRAM (SDRAM), magnetoresistive RAM (MRAM), resistive RAM (RRAM), or other types of memory devices. Video data memory 98 and decoded picture buffer 116 may be provided by the same memory device or separate memory devices. In various examples, video data memory 98 may be on-chip with other components of video encoder 20, or off-chip relative to those components.

Video encoder 20 may receive video data. Video encoder 20 may encode each CTU in a slice of a picture of the video data. Each of the CTUs may be associated with equally-sized luma coding tree blocks (CTBs) and corresponding CTBs of the picture. As part of encoding a CTU, prediction processing unit 100 may perform quad-tree partitioning to divide the CTBs of the CTU into progressively-smaller blocks. The smaller block may be coding blocks of CUs. For example, prediction processing unit 100 may partition a CTB associated with a CTU into four equally-sized sub-blocks, partition one or more of the sub-blocks into four equally-sized sub-sub-blocks, and so on.

Video encoder 20 may encode CUs of a CTU to generate encoded representations of the CUs (i.e., coded CUs). As part of encoding a CU, prediction processing unit 100 may partition the coding blocks associated with the CU among one or more PUs of the CU. Thus, each PU may be associated with a luma prediction block and corresponding chroma prediction blocks. Video encoder 20 and video decoder 30 may support PUs having various sizes. As indicated above, the size of a CU may refer to the size of the luma coding block of the CU and the size of a PU may refer to the size of a luma prediction block of the PU. Assuming that the size of a particular CU is 2N×2N, video encoder 20 and video decoder 30 may support PU sizes of 2N×2N or N×N for intra prediction, and symmetric PU sizes of 2N×2N, 2N×N, N×2N, N×N, or similar for inter prediction. Video encoder 20 and video decoder 30 may also support asymmetric partitioning for PU sizes of 2N×nU, 2N×nD, nL×2N, and nR×2N for inter prediction.

Inter-prediction processing unit 120 may generate predictive data for a PU by performing inter prediction on each PU of a CU. The predictive data for the PU may include one or more predictive sample blocks of the PU and motion information for the PU. Inter-prediction unit 121 may perform different operations for a PU of a CU depending on whether the PU is in an I slice, a P slice, or a B slice. In an I slice, all PUs are intra predicted. Hence, if the PU is in an I slice, inter-prediction unit 121 does not perform inter prediction on the PU. Thus, for blocks encoded in I-mode, the predictive block is formed using spatial prediction from previously-encoded neighboring blocks within the same frame.

If a PU is in a P slice, the motion estimation unit of inter-prediction processing unit 120 may search the reference pictures in a list of reference pictures (e.g., "RefPicList0") for a reference region for the PU. The reference region for the PU may be a region, within a reference picture, that contains sample blocks that most closely correspond to the sample blocks of the PU. The motion estimation unit may generate a reference index that indicates a position in RefPicList0 of the reference picture containing the reference region for the PU. In addition, the motion estimation unit may generate an MV that indicates a spatial displacement between a coding block of the PU and a reference location associated with the reference region. For instance, the MV may be a two-dimensional vector that provides an offset from the coordinates in the current decoded picture to coordinates in a reference picture. The motion estimation unit may output the reference index and the MV as the motion information of the PU. The motion compensation unit of inter-prediction processing unit 120 may generate the predictive sample blocks of the PU based on actual or interpolated samples at the reference location indicated by the motion vector of the PU.

If a PU is in a B slice, the motion estimation unit may perform uni-prediction or bi-prediction for the PU. To perform uni-prediction for the PU, the motion estimation unit may search the reference pictures of RefPicList0 or a second reference picture list ("RefPicList1") for a reference region for the PU. The motion estimation unit may output, as the motion information of the PU, a reference index that indicates a position in RefPicList0 or RefPicList1 of the reference picture that contains the reference region, an MV that indicates a spatial displacement between a sample block of the PU and a reference location associated with the reference region, and one or more prediction direction indicators that indicate whether the reference picture is in RefPicList0 or RefPicList1. The motion compensation unit of inter-prediction processing unit 120 may generate the predictive sample blocks of the PU based at least in part on actual or interpolated samples at the reference region indicated by the motion vector of the PU.

To perform bi-directional inter prediction for a PU, the motion estimation unit may search the reference pictures in RefPicList0 for a reference region for the PU and may also search the reference pictures in RefPicList1 for another reference region for the PU. The motion estimation unit may generate reference picture indexes that indicate positions in RefPicList0 and RefPicList1 of the reference pictures that contain the reference regions. In addition, the motion estimation unit may generate MVs that indicate spatial displacements between the reference location associated with the reference regions and a sample block of the PU. The motion information of the PU may include the reference indexes and the MVs of the PU. The motion compensation unit may generate the predictive sample blocks of the PU based at least in part on actual or interpolated samples at the reference region indicated by the motion vector of the PU.

In accordance with various examples of this disclosure, video encoder 20 may be configured to perform palette-based coding. With respect to the HEVC framework, as an example, the palette-based coding techniques may be configured to be used as a CU mode. In other examples, the palette-based coding techniques may be configured to be used as a PU mode in the framework of HEVC. Accordingly, all of the disclosed processes described herein (throughout this disclosure) in the context of a CU mode may, additionally or alternatively, apply to a PU mode. However, these HEVC-based examples should not be considered a restriction or limitation of the palette-based coding techniques described herein, as such techniques may be applied to work independently or as part of other existing or yet to be developed systems/standards. In these cases, the unit for palette coding can be square blocks, rectangular blocks or even regions of non-rectangular shape.

Palette-based encoding unit 122, for example, may perform palette-based encoding when a palette-based encoding mode is selected, e.g., for a CU or PU. For example, palette-based encoding unit 122 may be configured to generate a palette having entries indicating pixel values, select pixel values in a palette to represent pixel values of at least some positions of a block of video data, and signal information, such as index values, associating at least some of the positions of the block of video data with entries in the palette corresponding, respectively, to the selected pixel values. Although various functions are described as being performed by palette-based encoding unit 122, some or all of such functions may be performed by other processing units, or a combination of different processing units.

Palette-based encoding unit 122 may be configured to generate any of the various syntax elements described herein. Accordingly, video encoder 20 may be configured to encode blocks of video data using palette-based code modes as described in this disclosure. Video encoder 20 may selectively encode a block of video data using a palette coding mode, or encode a block of video data using a different mode, e.g., such an HEVC inter-predictive or intra-predictive coding mode. The block of video data may be, for example, a CU or PU generated according to an HEVC coding process. A video encoder 20 may encode some blocks with inter-predictive temporal prediction or intra-predictive spatial coding modes and decode other blocks with the palette-based coding mode.

Intra-prediction processing unit 126 may generate predictive data for a PU by performing intra prediction on the PU. The predictive data for the PU may include predictive sample blocks for the PU and various syntax elements. Intra-prediction processing unit 126 may perform intra prediction on PUs in I slices, P slices, and B slices.

To perform intra prediction on a PU, intra-prediction processing unit 126 may use multiple intra prediction modes to generate multiple sets of predictive data for the PU. When using some intra prediction modes to generate a set of predictive data for the PU, intra-prediction processing unit 126 may extend values of samples from sample blocks of neighboring PUs across the predictive blocks of the PU in directions associated with the intra prediction modes. The neighboring PUs may be above, above and to the right, above and to the left, or to the left of the PU, assuming a left-to-right, top-to-bottom encoding order for PUs, CUs, and CTUs. Intra-prediction processing unit 126 may use various numbers of intra prediction modes, e.g., 33 directional intra prediction modes. In some examples, the number of intra prediction modes may depend on the size of the region associated with the PU.

Prediction processing unit 100 may select the predictive data for PUs of a CU from among the predictive data generated by inter-prediction processing unit 120 for the PUs or the predictive data generated by intra-prediction processing unit 126 for the PUs. In some examples, prediction processing unit 100 selects the predictive data for the PUs of the CU based on rate/distortion metrics of the sets of predictive data. The predictive sample blocks of the selected predictive data may be referred to herein as the selected predictive sample blocks.

Residual generation unit 102 may generate, based on the coding blocks (e.g., luma, Cb and Cr coding blocks) of a CU and the selected predictive sample blocks (e.g., predictive luma, Cb and Cr blocks) of the PUs of the CU, residual blocks (e.g., luma, Cb and Cr residual blocks) of the CU. For instance, residual generation unit 102 may generate the residual blocks of the CU such that each sample in the residual blocks has a value equal to a difference between a sample in a coding block of the CU and a corresponding sample in a corresponding selected predictive sample block of a PU of the CU.

Transform processing unit 104 may perform quad-tree partitioning to partition the residual blocks associated with a CU into transform blocks associated with TUs of the CU. Thus, in some examples, a TU may be associated with a luma transform block and two chroma transform blocks. The sizes and positions of the luma and chroma transform blocks of TUs of a CU may or may not be based on the sizes and positions of prediction blocks of the PUs of the CU. A quad-tree structure known as a "residual quad-tree" (RQT) may include nodes associated with each of the regions. The TUs of a CU may correspond to leaf nodes of the RQT.

Transform processing unit 104 may generate transform coefficient blocks for each TU of a CU by applying one or more transforms to the transform blocks of the TU. Transform processing unit 104 may apply various transforms to a transform block associated with a TU. For example, transform processing unit 104 may apply a discrete cosine transform (DCT), a directional transform, or a conceptually similar transform to a transform block. In some examples, transform processing unit 104 does not apply transforms to a transform block. In such examples, the transform block may be treated as a transform coefficient block.

Quantization unit 106 may quantize the transform coefficients in a coefficient block. The quantization process may reduce the bit depth associated with some or all of the transform coefficients. For example, an n-bit transform coefficient may be rounded down to an m-bit transform coefficient during quantization, where n is greater than m. Quantization unit 106 may quantize a coefficient block associated with a TU of a CU based on a quantization parameter (QP) value associated with the CU. Video encoder 20 may adjust the degree of quantization applied to the coefficient blocks associated with a CU by adjusting the QP value associated with the CU. Quantization may introduce loss of information, thus quantized transform coefficients may have lower precision than the original ones.

Inverse quantization unit 108 and inverse transform processing unit 110 may apply inverse quantization and inverse transforms to a coefficient block, respectively, to reconstruct a residual block from the coefficient block. Reconstruction unit 112 may add the reconstructed residual block to corresponding samples from one or more predictive sample blocks generated by prediction processing unit 100 to produce a reconstructed transform block associated with a TU. By reconstructing transform blocks for each TU of a CU in this way, video encoder 20 may reconstruct the coding blocks of the CU.

Filter unit 114 may perform one or more deblocking operations to reduce blocking artifacts in the coding blocks associated with a CU. Decoded picture buffer 116 may store the reconstructed coding blocks after filter unit 114 performs the one or more deblocking operations on the reconstructed coding blocks. Inter-prediction processing unit 120 may use a reference picture that contains the reconstructed coding blocks to perform inter prediction on PUs of other pictures. In addition, intra-prediction processing unit 126 may use reconstructed coding blocks in decoded picture buffer 116 to perform intra prediction on other PUs in the same picture as the CU.

Entropy encoding unit 118 may receive data from other functional components of video encoder 20. For example, entropy encoding unit 118 may receive coefficient blocks from quantization unit 106 and may receive syntax elements from prediction processing unit 100. Entropy encoding unit 118 may perform one or more entropy encoding operations on the data to generate entropy-encoded data. For example, entropy encoding unit 118 may perform a CABAC operation, a context-adaptive variable length coding (CAVLC) operation, a variable-to-variable (V2V) length coding operation, a syntax-based context-adaptive binary arithmetic coding (SBAC) operation, a Probability Interval Partitioning Entropy (PIPE) coding operation, an Exponential-Golomb encoding operation, or another type of entropy encoding operation on the data. Video encoder 20 may output a bitstream that includes entropy-encoded data generated by entropy encoding unit 118. For instance, the bitstream may include data that represents a RQT for a CU.

In some examples, residual coding is not performed with palette coding. Accordingly, video encoder 20 may not perform transformation or quantization when coding using a palette coding mode. In addition, video encoder 20 may entropy encode data generated using a palette coding mode separately from residual data.

According to one or more of the techniques of this disclosure, video encoder 20, and specifically palette-based encoding unit 122, may perform palette-based video coding of predicted video blocks. As described above, a palette generated by video encoder 20 may be explicitly encoded, predicted from previous palette entries, predicted from previous pixel values, or a combination thereof.

In particular, prediction processing unit 100 may determine an encoding mode for a block (e.g., a CU or PU) of video data, such as inter-prediction, intra-prediction, or palette mode. Assuming palette mode is selected, palette-based encoding unit 122 may form a palette for the block based on statistics of pixel values for the block. For each pixel of the block, palette-based encoding unit 122 may determine whether the pixel has a corresponding value in the palette, and if so, signal an index into the palette to the corresponding value for the pixel. Palette-based encoding unit 122 may also signal a run value, representing a number of pixels having the same value as the previous pixel.

Alternatively, if a sequence of pixels has values equal to above-neighboring pixels, palette-based encoding unit 122 may signal a run value for "copy-from-above" mode, where the run represents the number of pixels having values equal to above-neighboring pixels.

If neither the index mode nor the copy-from-above mode adequately represents the value of a current pixel of the palette-mode coded block, palette-based encoding unit 122 may use the techniques of this disclosure to code the pixel as an escape pixel. In accordance with the techniques of this disclosure, video encoder 20 may encode the value of an escape pixel in two parts, a first portion and a second portion. The first and second portions, when concatenated, may represent the value of the escape pixel. Entropy encoding unit 118 may encode the first portion using a Golomb rice codeword and the second portion using an exponential Golomb with parameter 3 codeword. In still other examples, video encoder 20 and/or video decoder 30 may code (encode or decode, respectively) only a single value using exponential Golomb coding with parameter 3, where this value represents the entire value for the escape pixel. In still other examples, entropy encoding unit 118 may encode only a single value using exponential Golomb coding with parameter 3, where this value represents the entire value for the escape pixel.

In some examples, entropy encoding unit 118 may encode the second portion using truncated exponential Golomb coding. Truncated exponential Golomb coding may be based on a determined maximum quantized escape pixel value. Video encoder 20 (more particularly, entropy encoding unit 118) may determine the maximum quantized escape pixel value using any of the various techniques described herein.

For example, entropy encoding unit 118 may determine a quantization step size value based on a quantization parameter for the block according to formula (2) above, and then use the quantization step size to determine the maximum quantized escape pixel value, e.g., according to process (3) above. In particular, in process (3), a temporary value is initialized to the quantized step value determined using formula (2). Then, while the temporary value is less than (1<<bitDepth)−1, i.e., the value one left-shifted by bit depth, minus 1, the temporary value is increased by the determined quantized step value, and the maximum quantized escape pixel value (initialized to one) is increased by one. Alternatively, entropy encoding unit 118 may determine the maximum quantized escape pixel value according to process (4) above.

As another example, video encoder 20 may signal values for certain encoder variables, such as a quantization scale value (quantScale), a right shift parameter value (rightShiftParam), and a right shift offset value (rightShiftOffset). Typically, these values would only be available to video encoder 20, but in this example, video encoder 20 may signal values for these elements in the bitstream, and also use these values to determine the maximum quantized escape pixel value. Video encoder 20 may signal values for these elements using one or more look up tables. Furthermore, entropy encoding unit 118 may calculate the maximum quantized escape pixel value using processes (5), (6), and (7) above. As can be seen, process (7) includes calculating the maximum quantized escape pixel value cMax using quantScale, rightShiftOffset, and rightShiftParam. Alternatively, entropy encoding unit 118 may calculate the maximum quantized escape pixel value using process (8), which uses the quantScale, rightShiftOffset, and rightShiftParam elements, and omits clipping and division operations.

As yet another example, entropy encoding unit 118 may determine the maximum quantized escape pixel value using process (9) above, which uses a look up table based on a quantization parameter (qP) and a bit depth. The look up table may be defined according to either of Tables 3 or 4, or other look up tables.

As another example, entropy encoding unit 118 may determine the maximum quantized escape pixel using processes (10) to (13) above. That is, entropy encoding unit 118 may determine a qPBase value (using process (10)), which may be a predetermined value. Entropy encoding unit 118 may then determine a quantBits value from the quantization parameter (qP) and the qPBase value using process (11), then determine a maxBit value according to process (12) from the bit depth and the determined quantBits value. Finally, entropy encoding unit 118 may determine the maximum quantized escape pixel value (cMax) according to process (13) as a value of 1 left-shifted by the maxBit value, minus 1.

As noted above, any of these various example techniques may be used to determine a maximum quantized escape pixel value, which entropy encoding unit 118 may use to perform truncated exponential Golomb coding of the second portion of the escape pixel value. Alternatively, entropy encoding unit 118 may use any of these various techniques to perform truncated binary coding of the escape pixel value, without performing a combination of Golomb rice coding and exponential Golomb coding with parameter 3.

In this manner, video encoder 20 represents an example of a video encoder configured to determine a value for an escape pixel of a palette-mode coded block of video data, and encode an exponential Golomb codeword representative of at least a portion of the value for the escape pixel, wherein to encode the exponential Golomb codeword, the video encoder is configured to use exponential Golomb with parameter 3 encoding.

Figure 3:
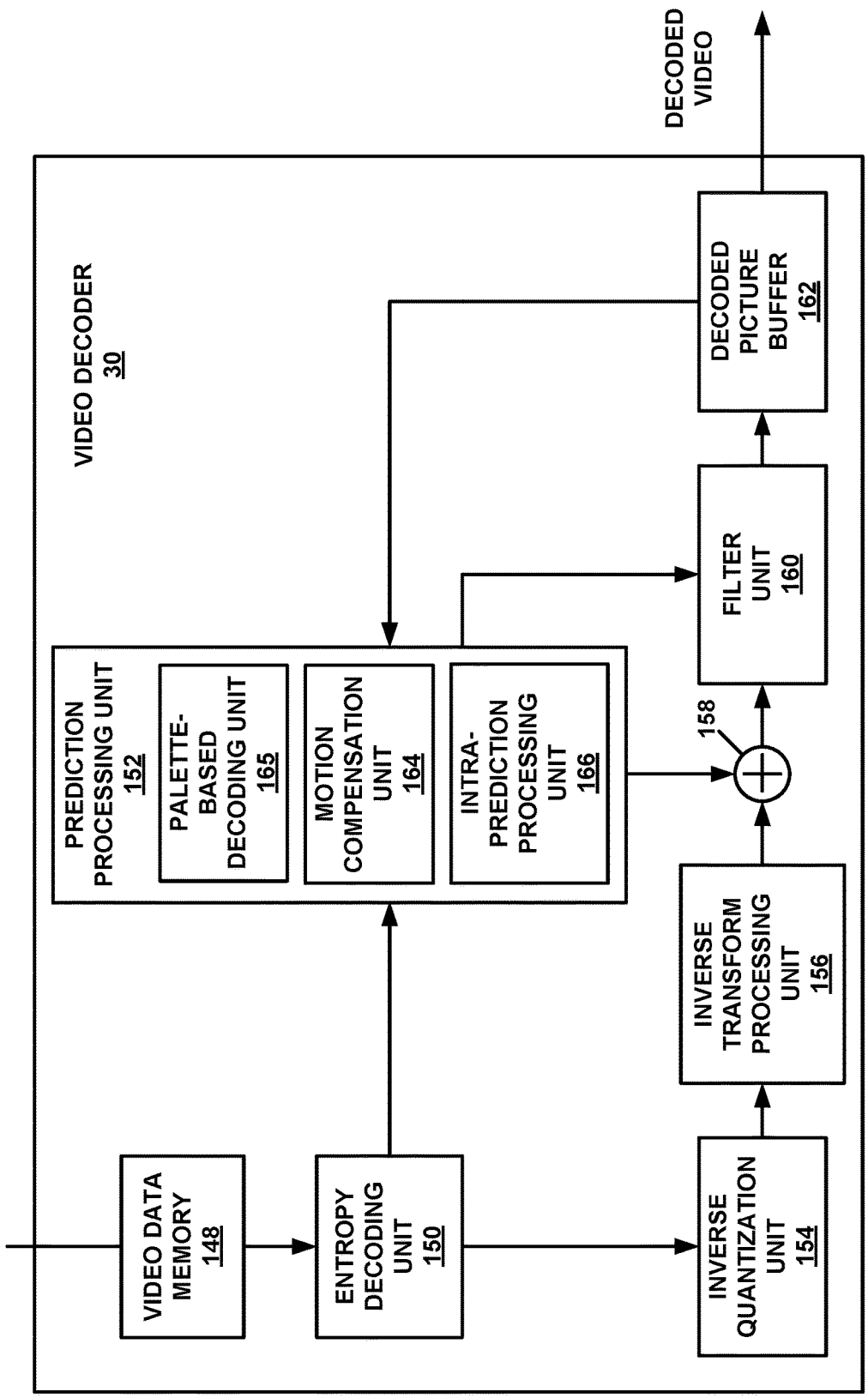
FIG. 3 is a block diagram illustrating an example video decoder that may implement the techniques described in this disclosure.

FIG. 3 is a block diagram illustrating an example video decoder 30 that is configured to implement the techniques of this disclosure. FIG. 3 is provided for purposes of explanation and is not limiting on the techniques as broadly exemplified and described in this disclosure. For purposes of explanation, this disclosure describes video decoder 30 in the context of HEVC coding. However, the techniques of this disclosure may be applicable to other coding standards or methods.

In the example of FIG. 3, video decoder 30 includes a video data memory 148, an entropy decoding unit 150, a prediction processing unit 152, an inverse quantization unit 154, an inverse transform processing unit 156, a reconstruction unit 158, a filter unit 160, and a decoded picture buffer 162. Prediction processing unit 152 includes a motion compensation unit 164 and an intra-prediction processing unit 166. Video decoder 30 also includes a palette-based decoding unit 165 configured to perform various aspects of the palette-based coding techniques described in this disclosure. In other examples, video decoder 30 may include more, fewer, or different functional components.

Video data memory 148 may store video data, such as an encoded video bitstream, to be decoded by the components of video decoder 30. The video data stored in video data memory 148 may be obtained, for example, from computer-readable medium 16, e.g., from a local video source, such as a camera, via wired or wireless network communication of video data, or by accessing physical data storage media. Video data memory 148 may form a coded picture buffer (CPB) that stores encoded video data from an encoded video bitstream. Decoded picture buffer 162 may be a reference picture memory that stores reference video data for use in decoding video data by video decoder 30, e.g., in intra- or inter-coding modes. Video data memory 148 and decoded picture buffer 162 may be formed by any of a variety of memory devices, such as dynamic random access memory (DRAM), including synchronous DRAM (SDRAM), magnetoresistive RAM (MRAM), resistive RAM (RRAM), or other types of memory devices. Video data memory 148 and decoded picture buffer 162 may be provided by the same memory device or separate memory devices. In various examples, video data memory 148 may be on-chip with other components of video decoder 30, or off-chip relative to those components.

Video data memory 148, i.e., a CPB, may receive and store encoded video data (e.g., NAL units) of a bitstream. Entropy decoding unit 150 may receive encoded video data (e.g., NAL units) from video data memory 148 and may parse the NAL units to decode syntax elements. Entropy decoding unit 150 may entropy decode entropy-encoded syntax elements in the NAL units. Prediction processing unit 152, inverse quantization unit 154, inverse transform processing unit 156, reconstruction unit 158, and filter unit 160 may generate decoded video data based on the syntax elements obtained (e.g., extracted) from the bitstream.

The NAL units of the bitstream may include coded slice NAL units. As part of decoding the bitstream, entropy decoding unit 150 may extract and entropy decode syntax elements from the coded slice NAL units. Each of the coded slices may include a slice header and slice data. The slice header may contain syntax elements pertaining to a slice. The syntax elements in the slice header may include a syntax element that identifies a PPS associated with a picture that contains the slice.

In addition to decoding syntax elements from the bitstream, video decoder 30 may perform a reconstruction operation on a non-partitioned CU. To perform the reconstruction operation on a non-partitioned CU, video decoder 30 may perform a reconstruction operation on each TU of the CU. By performing the reconstruction operation for each TU of the CU, video decoder 30 may reconstruct residual blocks of the CU.

As part of performing a reconstruction operation on a TU of a CU, inverse quantization unit 154 may inverse quantize, i.e., de-quantize, coefficient blocks associated with the TU. Inverse quantization unit 154 may use a QP value associated with the CU of the TU to determine a degree of quantization and, likewise, a degree of inverse quantization for inverse quantization unit 154 to apply. That is, the compression ratio, i.e., the ratio of the number of bits used to represent original sequence and the compressed one, may be controlled by adjusting the value of the QP used when quantizing transform coefficients. The compression ratio may also depend on the method of entropy coding employed.

After inverse quantization unit 154 inverse quantizes a coefficient block, inverse transform processing unit 156 may apply one or more inverse transforms to the coefficient block in order to generate a residual block associated with the TU. For example, inverse transform processing unit 156 may apply an inverse DCT, an inverse integer transform, an inverse Karhunen-Loeve transform (KLT), an inverse rotational transform, an inverse directional transform, or another inverse transform to the coefficient block.

If a PU is encoded using intra prediction, intra-prediction processing unit 166 may perform intra prediction to generate predictive blocks for the PU. Intra-prediction processing unit 166 may use an intra prediction mode to generate the predictive luma, Cb and Cr blocks for the PU based on the prediction blocks of spatially-neighboring PUs. Intra-prediction processing unit 166 may determine the intra prediction mode for the PU based on one or more syntax elements decoded from the bitstream.

Prediction processing unit 152 may construct a first reference picture list (RefPicList0) and a second reference picture list (RefPicList1) based on syntax elements extracted from the bitstream. Furthermore, if a PU is encoded using inter prediction, entropy decoding unit 150 may extract motion information for the PU. Motion compensation unit 164 may determine, based on the motion information of the PU, one or more reference regions for the PU. Motion compensation unit 164 may generate, based on samples blocks at the one or more reference blocks for the PU, predictive blocks (e.g., predictive luma, Cb and Cr blocks) for the PU.

Reconstruction unit 158 may use the transform blocks (e.g., luma, Cb and Cr transform blocks) associated with TUs of a CU and the predictive blocks (e.g., luma, Cb and Cr blocks) of the PUs of the CU, i.e., either intra-prediction data or inter-prediction data, as applicable, to reconstruct the coding blocks (e.g., luma, Cb and Cr coding blocks) of the CU. For example, reconstruction unit 158 may add samples of the transform blocks (e.g., luma, Cb and Cr transform blocks) to corresponding samples of the predictive blocks (e.g., predictive luma, Cb and Cr blocks) to reconstruct the coding blocks (e.g., luma, Cb and Cr coding blocks) of the CU.

Filter unit 160 may perform a deblocking operation to reduce blocking artifacts associated with the coding blocks (e.g., luma, Cb and Cr coding blocks) of the CU. Video decoder 30 may store the coding blocks (e.g., luma, Cb and Cr coding blocks) of the CU in decoded picture buffer 162. Decoded picture buffer 162 may provide reference pictures for subsequent motion compensation, intra prediction, and presentation on a display device, such as display device 32 of FIG. 1. For instance, video decoder 30 may perform, based on the blocks (e.g., luma, Cb and Cr blocks) in decoded picture buffer 162, intra prediction or inter prediction operations on PUs of other CUs. In this way, video decoder 30 may extract, from the bitstream, transform coefficient levels of a significant coefficient block, inverse quantize the transform coefficient levels, apply a transform to the transform coefficient levels to generate a transform block, generate, based at least in part on the transform block, a coding block, and output the coding block for display.

In accordance with various examples of this disclosure, video decoder 30 may be configured to perform palette-based coding. In particular, video decoder 30 includes palette-based decoding unit 165 that may perform palette-based coding. For example, palette-based decoding unit 165 may be configured to generate a palette having entries indicating pixel values. Furthermore, in this example, palette-based decoding unit 165 may receive information associating at least some positions of a block of video data with entries in the palette. In this example, palette-based decoding unit 165 may select pixel values in the palette based on the information. Additionally, in this example, palette-based decoding unit 165 may reconstruct pixel values of the block based on the selected pixel values. Although various functions are described as being performed by palette-based decoding unit 165, some or all of such functions may be performed by other processing units, or a combination of different processing units.

Palette-based decoding unit 165 may receive palette coding mode information, and perform the above operations when the palette coding mode information indicates that the palette coding mode applies to the block. When the palette coding mode information indicates that the palette coding mode does not apply to the block, or when other mode information indicates the use of a different mode, palette-based decoding unit 165 decodes the block of video data using a non-palette based coding mode, e.g., such an HEVC inter-predictive or intra-predictive coding mode, when the palette coding mode information indicates that the palette coding mode does not apply to the block. The block of video data may be, for example, a CU or PU generated according to an HEVC coding process. Video decoder 30 may decode some blocks with inter-predictive temporal prediction or intra-predictive spatial coding modes and decode other blocks with the palette-based coding mode. The palette-based coding mode may comprise one of a plurality of different palette-based coding modes, or there may be a single palette-based coding mode.

According to one or more of the techniques of this disclosure, video decoder 30, and specifically palette-based decoding unit 165, may perform palette-based video decoding of palette-coded video blocks. As described above, a palette decoded by video decoder 30 may be explicitly encoded and signaled, reconstructed by video decoder 30 with respect to a received palette-coded block, predicted from previous palette entries, predicted from previous pixel values, or a combination thereof.

In particular, entropy decoding unit 150 may decode information indicating that a block (e.g., a PU or CU) of video data is coded using palette mode. Entropy decoding unit 150 may further decode information representative of how each pixel of the block is coded using palette mode. For example, entropy decoding unit 150 may decode an index value and a run value as an {index, run} pair. The index value represents an entry of the palette for the block, where the entry specifies a pixel value, and the run value indicates a number of pixels in addition to the current pixel that have the same value.

If the index value is equal to the size of the palette, entropy decoding unit 150 may determine that the current pixel is an escape pixel. Thus, in accordance with the techniques of this disclosure, entropy decoding unit 150 may decode two subsequent values of the bitstream: a Golomb-rice coded first value and an exponential Golomb with parameter 3 coded second value. The first value represents a first portion of the value of the escape pixel, while the second value represents a second portion of the value of the escape pixel. Thus, after decoding the first value and the second value (producing the first portion and the second portion, respectively), entropy decoding unit 150 may concatenate the first portion and the second portion to reproduce the value of the escape pixel, and provide the value of the escape pixel to palette-based decoding unit 165. Alternatively, entropy decoding unit 150 may provide the first portion and the second portion to palette-based decoding unit 165, which may concatenate the first portion and the second portion to reproduce the value of the escape pixel. In still other examples, entropy decoding unit 150 may decode only a single value using exponential Golomb coding with parameter 3, where this value represents the entire value for the escape pixel.

In some examples, entropy decoding unit 150 may decode the second portion using truncated exponential Golomb coding. Truncated exponential Golomb coding may be based on a determined maximum quantized escape pixel value. Video decoder 30 (more particularly, entropy decoding unit 150) may determine the maximum quantized escape pixel value using any of the various techniques described herein.

For example, entropy decoding unit 150 may determine a quantization step size value based on a quantization parameter for the block according to formula (2) above, and then use the quantization step size to determine the maximum quantized escape pixel value, e.g., according to process (3) above. In particular, in process (3), a temporary value is initialized to the quantized step value determined using formula (2). Then, while the temporary value is less than (1<<bitDepth)−1, i.e., the value one left-shifted by bit depth, minus 1, the temporary value is increased by the determined quantized step value, and the maximum quantized escape pixel value (initialized to one) is increased by one. Alternatively, entropy decoding unit 150 may determine the maximum quantized escape pixel value according to process (4) above.

As another example, video decoder 30 may receive values for certain encoder variables, such as a quantization scale value (quantScale), a right shift parameter value (rightShiftParam), and a right shift offset value (rightShiftOffset). Typically, these values would only be available to a video encoder, but in this example, video decoder 30 may decode values for these elements from the bitstream, and also use these values to determine the maximum quantized escape pixel value. Video decoder 30 may decode indexes into one or more look up tables that represent these encoder variables. Furthermore, entropy decoding unit 150 may calculate the maximum quantized escape pixel value using processes (5), (6), and (7) above. As can be seen, process (7) includes calculating the maximum quantized escape pixel value cMax using quantScale, rightShiftOffset, and rightShiftParam. Alternatively, entropy decoding unit 150 may calculate the maximum quantized escape pixel value using process (8), which uses the quantScale, rightShiftOffset, and rightShiftParam elements, and omits clipping and division operations.

As yet another example, entropy decoding unit 150 may determine the maximum quantized escape pixel value using process (9) above, which uses a look up table based on a quantization parameter (qP) and a bit depth. The look up table may be defined according to either of Tables 3 or 4, or other look up tables.

As another example, entropy decoding unit 150 may determine the maximum quantized escape pixel using processes (10) to (13) above. That is, entropy decoding unit 150 may determine a qPBase value (using process (10)), which may be a predetermined value. Entropy decoding unit 150 may then determine a quantBits value from the quantization parameter (qP) and the qPBase value using process (11), then determine a maxBit value according to process (12) from the bit depth and the determined quantBits value. Finally, entropy decoding unit 150 may determine the maximum quantized escape pixel value (cMax) according to process (13) as a value of 1 left-shifted by the maxBit value, minus 1.

As noted above, any of these various example techniques may be used to determine a maximum quantized escape pixel value, which entropy decoding unit 150 may use to perform truncated exponential Golomb coding of the second portion of the escape pixel value. Alternatively, entropy decoding unit 150 may use any of these various techniques to perform truncated binary coding of the escape pixel value, without performing a combination of Golomb rice coding and exponential Golomb coding with parameter 3.

Again, entropy decoding unit 150 may perform the processes above to decode an escape pixel value, signaled by a palette index value that is equal to the size of the palette. Alternatively, entropy decoding unit 150 may decode only a run value. The run value signifies a number of pixels coded using copy from above mode. Entropy decoding unit 150 may provide the decoded run value to palette-based decoding unit 165. Thus, palette-based decoding unit 165 may retrieve values for each of these pixels from respective above-neighboring pixels.

In this manner, video decoder 30 represents an example of a video decoder configured to decode an exponential Golomb codeword representative of at least a portion of a value for an escape pixel of a palette-mode coded block, wherein the video decoder is configured to decode the exponential Golomb codeword using exponential Golomb with parameter 3 decoding, and decode the block using the value for the escape pixel.

Figure 4:
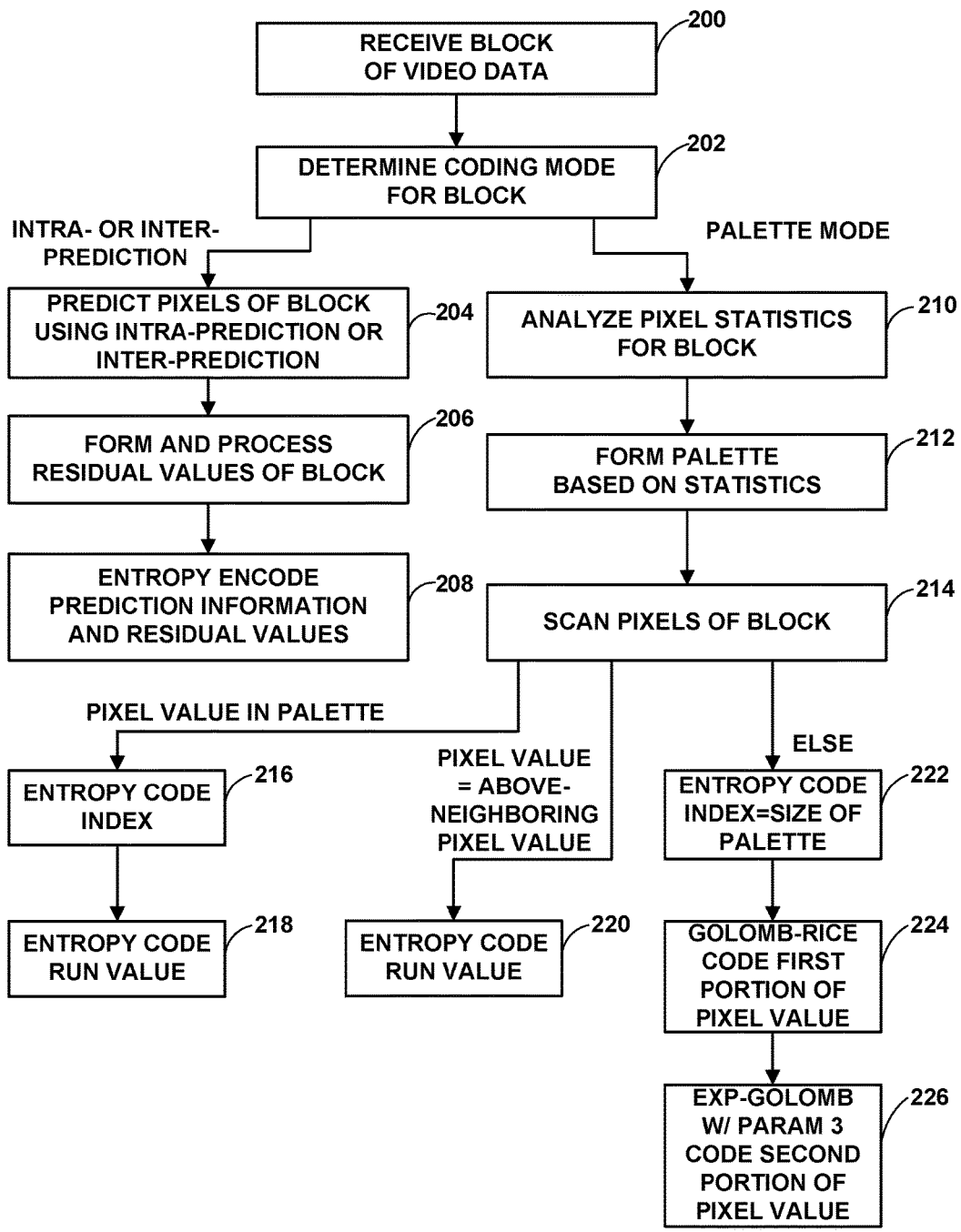
FIG. 4 is a flowchart illustrating an example method for encoding a block of video data in accordance with the techniques of this disclosure.

FIG. 4 is a flowchart illustrating an example method for encoding a block of video data in accordance with the techniques of this disclosure. The method of FIG. 4 may be performed by video encoder 20 and the components thereof (e.g., illustrated in FIG. 2).

In this example, prediction processing unit 100 initially receives a block of video data (200). The block may be, for example, a prediction unit (PU) or a coding unit (CU). Prediction processing unit 100 then determines a coding mode for the block (202). For example, prediction processing unit 100 may test various coding modes and compare the modes using a rate-distortion optimization (RDO) process. Furthermore, prediction processing unit 100 may also compare various block sizes and block partitioning schemes using the RDO process.

Prediction processing unit 100 may select an intra- or inter-prediction mode, in which case inter-prediction processing unit 120 or intra-prediction processing unit 126 may predict pixels of the block using intra-prediction or inter-prediction (204), respectively, forming a predicted block. Video encoder 20 may then form and process residual values of the block (206). For example, residual generation unit 102 may subtract the original block from the predicted block on a pixel-by-pixel basis, forming a residual block. Transform processing unit 104 may then transform the residual block using a transform such as, for example, a DCT, forming a transform block. Quantization unit 106 may then quantize transform coefficients of the transform block, and provide the quantized transform coefficients to entropy encoding unit 118. Prediction processing unit 100 also provides information representative of the prediction mode (e.g., intra/inter, a selected intra mode if intra-prediction is used, or motion parameters if inter-prediction is used) to entropy encoding unit 118. Thus, entropy encoding unit 118 entropy encodes the prediction information and the residual values (i.e., the quantized transform coefficients) (208).

Alternatively, prediction processing unit 100 may select palette mode to code the block, in which case palette-based encoding unit 122 analyzes pixel statistics for the block (210). For example, palette-based encoding unit 122 may determine frequently used pixel values. Palette-based encoding unit 122 then forms a palette for the block based on the statistics (212). Although not shown in FIG. 4, entropy encoding unit 118 may entropy encode data for the palette. For example, the palette may be predictively coded relative to a previously used palette, e.g., as discussed above with respect to Tables 1 and 2.

Palette-based encoding unit 122 may then scan pixels of the block (214) to determine how to code the pixels. For example, palette-based encoding unit 122 may determine whether a current pixel value is included in the palette. If the pixel value is included in the palette, palette-based encoding unit 122 may provide an index from the palette that corresponds to the pixel value to entropy encoding unit 118, which may entropy encode the index value (216). Moreover, palette-based encoding unit 122 may determine a number of pixels in a row following the previous pixel that have the same value, and provide a "run" value to entropy encoding unit 118, which may entropy encode the run value (218).

Alternatively, if the current pixel does not have a value in the palette, palette-based encoding unit 122 may determine whether the value for the pixel is the same as an above-neighboring pixel value. In some examples, this determination may be made prior to determining whether the pixel value corresponds to a value in the palette. In any case, if the current pixel has a value that is equal to an above-neighboring pixel value, palette-based encoding unit 122 may provide a run value describing a number of pixels that have values equal to their above-neighboring pixels to entropy encoding unit 118, which may entropy encode the run value (220).

If the current pixel does not correspond to a value in the palette and does not have a value equal to an above-neighboring pixel, palette-based encoding unit 122 may encode the pixel as an escape pixel. In particular, palette-based encoding unit 122 may provide an index value equal to the size of the palette to entropy encoding unit 118, which may entropy code the index value as the size of the palette (222). An index value equal to the size of the palette may signal that the current pixel is being encoded as an escape pixel. Palette-based encoding unit 122 may further provide the value of the escape pixel to entropy encoding unit 118.

In accordance with the techniques of this disclosure, entropy encoding unit 118 may encode the value of the escape pixel in two parts. More particularly, entropy encoding unit 118 may split the value of the escape pixel into a first portion and a second portion. Entropy encoding unit 118 may Golomb-rice encode the first portion of the pixel value (224) and exponential Golomb with parameter 3 encode the second portion of the pixel value (226). Although not shown in FIG. 4, entropy encoding unit 118 may code the second portion using truncated exponential Golomb with parameter 3, based on a determined maximum quantized escape pixel value.

Video encoder 20 may perform this process (e.g., one of the sequence of steps 216 and 218, step 220, or the sequence of steps 222-226) for each pixel of the palette mode coded block.

In this manner, the method of FIG. 4 represents an example of a method including determining a value for an escape pixel of a palette-mode coded block of video data, and encoding an exponential Golomb codeword representative of at least a portion of the value for the escape pixel, wherein encoding the exponential Golomb codeword comprises encoding the exponential Golomb codeword using exponential Golomb with parameter 3 encoding.

Although the method of FIG. 4 includes encoding both a first portion of the value of the escape pixel using Golomb rice coding and a second portion of the value of the escape pixel using exponential Golomb coding, it should be understood that in other examples, the entire value for the escape pixel may be coded using only exponential Golomb coding (e.g., using parameter 3 for the exponential Golomb coding).

Figure 5:
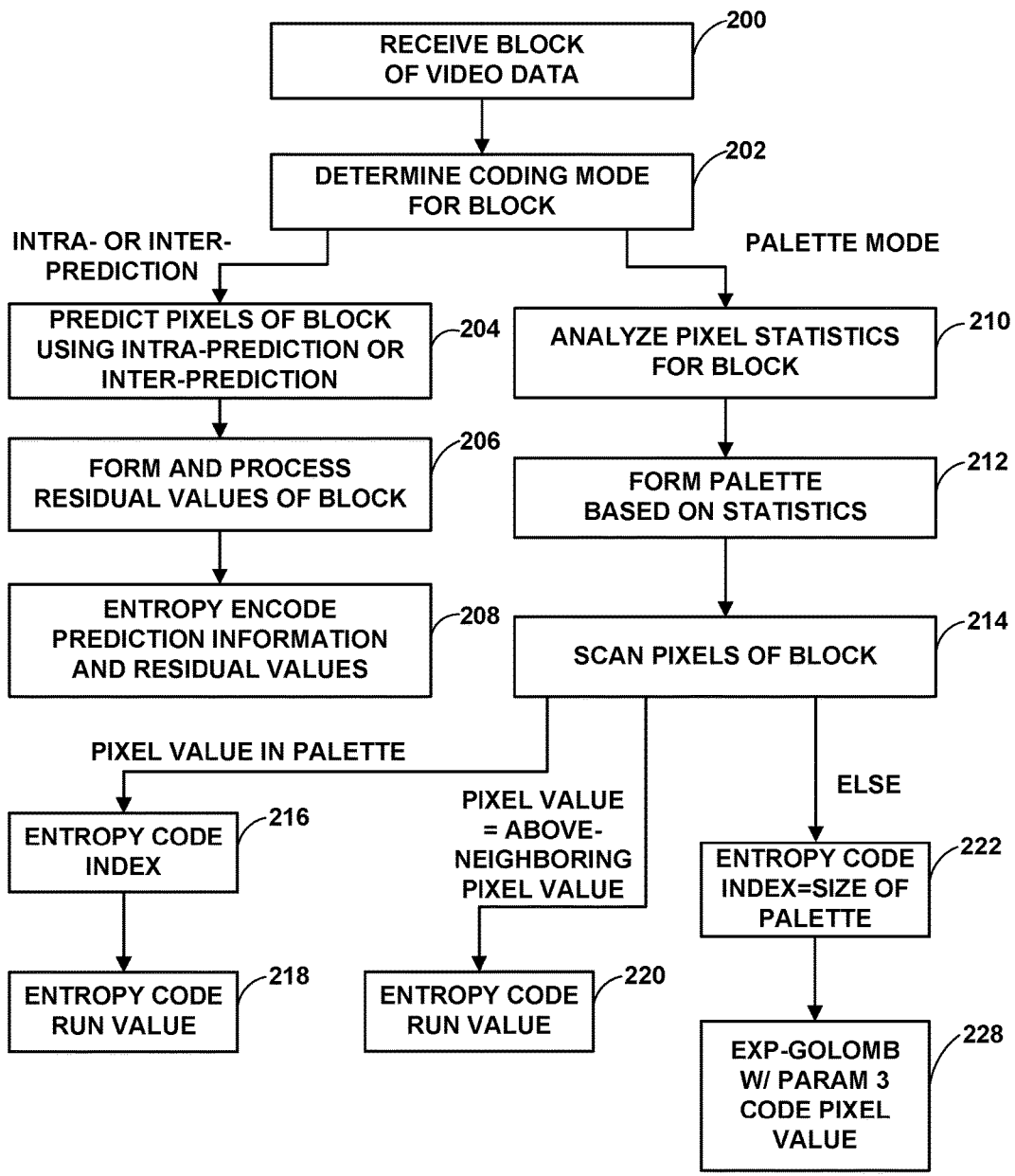
FIG. 5 is a flowchart illustrating another example method for encoding a block of video data in accordance with the techniques of this disclosure.

FIG. 5 is a flowchart illustrating another example method for encoding a block of video data in accordance with the techniques of this disclosure. The method of FIG. 5 may be performed by video encoder 20 and the components thereof (e.g., illustrated in FIG. 2). In general, the method of FIG. 5 conforms substantially to the method of FIG. 4. However, in FIG. 5, when the current pixel does not correspond to a value in the palette and does not have a value equal to an above-neighboring pixel, palette-based encoding unit 122 may encode the pixel as an escape pixel, and in particular, encode the value for the escape pixel using exponential Golomb with parameter 3 coding (228).

In this manner, the method of FIG. 5 represents another example of a method including determining a value for an escape pixel of a palette-mode coded block of video data, and encoding an exponential Golomb codeword representative of at least a portion of the value for the escape pixel, wherein encoding the exponential Golomb codeword comprises encoding the exponential Golomb codeword using exponential Golomb with parameter 3 encoding.

Figure 6:
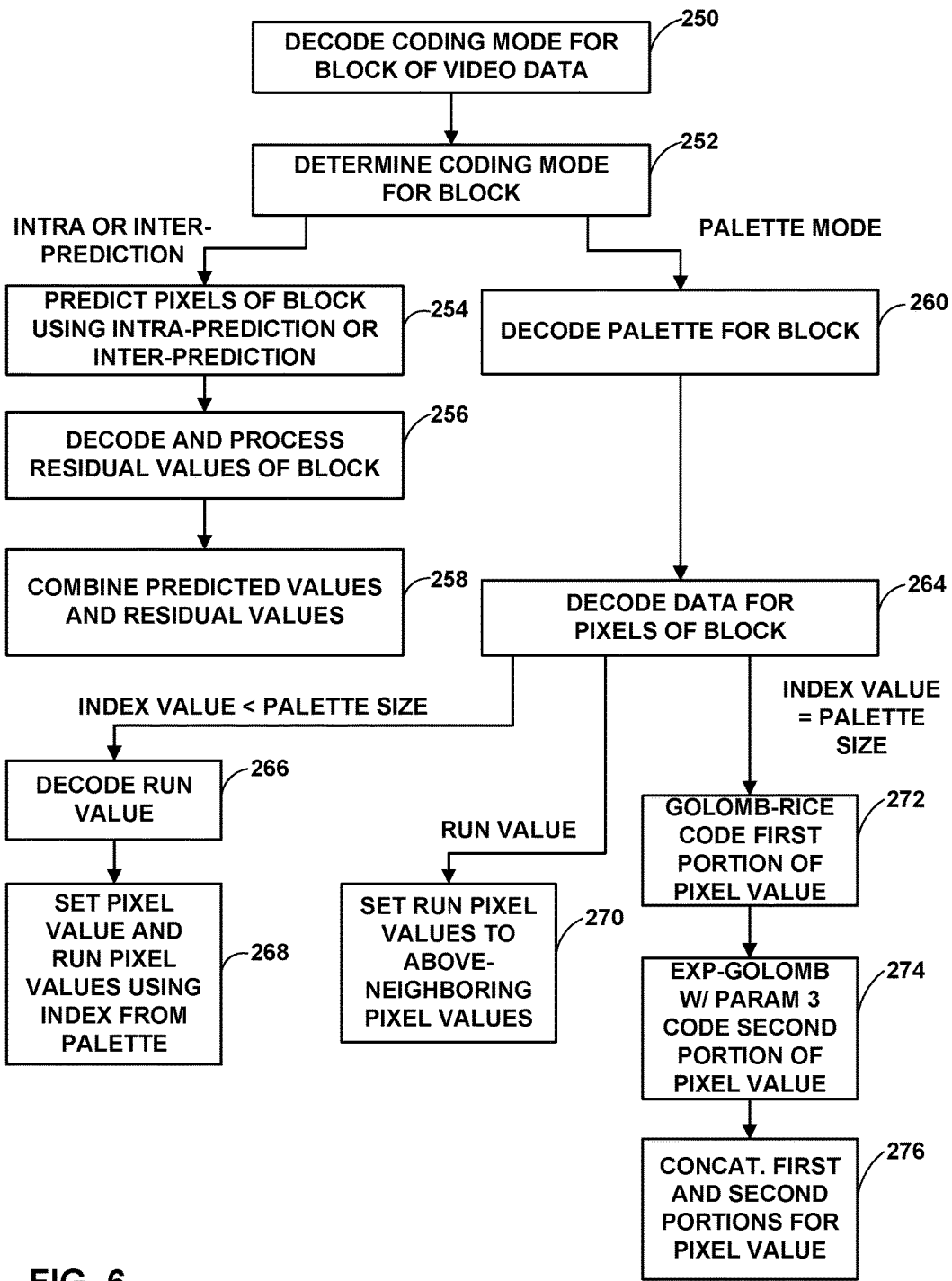
FIG. 6 is a flowchart illustrating an example method for decoding a block of video data in accordance with the techniques of this disclosure.

FIG. 6 is a flowchart illustrating an example method for decoding a block of video data in accordance with the techniques of this disclosure. The method of FIG. 6 may be performed by video decoder 30 and the components thereof (e.g., illustrated in FIG. 3).

Initially, entropy decoding unit 150 may decode data indicating a coding mode for a block of video data (250). Entropy decoding unit 150 may use this data to determine a coding mode for the block (252), e.g., one of intra-prediction, inter-prediction, or palette mode.

In the case that the coding mode is intra-prediction or inter-prediction, entropy decoding unit 150 may decode prediction information (e.g., an intra-mode or motion parameters) and provide the prediction information to prediction processing unit 152. Prediction processing unit 152 may use the prediction information to predict pixels of the block using intra-prediction or inter-prediction (254). For example, intra-prediction processing unit 166 may use an intra-prediction mode to construct a prediction block from neighboring pixels to the block. As another example, motion compensation unit 164 may use the motion parameters to retrieve (and potentially process, e.g., filter) a reference block from a previously decoded picture of decoded picture buffer 162.

In addition, video decoder 30 may decode and process residual values of the block (256). For example, inverse quantization unit 154 may inverse quantize quantized transform coefficients, and inverse transform processing unit 156 may inverse transform the transform coefficients, to reconstruct a residual block. Reconstruction unit 158 may then combine residual values of the residual block and predicted values of the predicted block (258) to reconstruct the original block.

Alternatively, entropy decoding unit 150 may determine that the coding mode for the block is palette mode. In this case, entropy decoding unit 150 may decode a palette for the block (260). As discussed above with respect to Tables 1 and 2, the palette may be predictively coded relative to a previous palette. Thus, entropy decoding unit 150 may provide decoded data for the palette to palette-based decoding unit 165, which may reconstruct the palette for the block using the decoded data.

Entropy decoding unit 150 may also decode data for pixels of the block (264). For example, the decoded data may correspond to an index value that is less than the size of the palette. In this case, entropy decoding unit 150 may also decode a run value (266) and provide the index and the run value to palette-based decoding unit 165. Palette based decoding unit 165 may set the value of the pixel and each of the pixels in the run equal to the pixel value of the palette that corresponds to the index value (268).

As another example, the decoded data may be a run value without an index value. Such a run value without an index value may indicate a number of pixels coded using copy from above mode. In this case, entropy decoding unit 150 may provide the run value to palette-based decoding unit 165, which may set values for each of the pixels in the run equal to the values of respective above-neighboring pixel values.

As another example, the decoded data may be an index value that is equal to the size of the palette. In this case, entropy decoding unit 150 may Golomb-rice decode a first value corresponding to a first portion of the pixel value (272). Entropy decoding unit 150 may also exponential Golomb with parameter 3 decode a second value corresponding to a second portion of the pixel value (274). As discussed above, entropy decoding unit 150 may alternatively determine a maximum quantized escape pixel value to perform truncated exponential Golomb with parameter 3 decoding of the second value. Entropy decoding unit 150 (or palette-based decoding unit 165) may then concatenate the first portion and the second portion to reproduce the pixel value (276).

Video decoder 30 may perform this process (e.g., one of the sequence of steps 266 and 268, step 270, or the sequence of steps 272-276) for each pixel of the palette mode coded block.

In this manner, the method of FIG. 6 represents an example of a method including decoding an exponential Golomb codeword representative of at least a portion of the value for an escape pixel of a palette-mode coded block of video data, wherein decoding the exponential Golomb codeword comprises decoding the exponential Golomb codeword using exponential Golomb with parameter 3 decoding, and decoding the block using the value for the escape pixel.

Although the method of FIG. 6 includes decoding both a first portion of the value of the escape pixel using Golomb rice coding and a second portion of the value of the escape pixel using exponential Golomb coding, it should be understood that in other examples, the entire value for the escape pixel may be coded using only exponential Golomb coding (e.g., using parameter 3 for the exponential Golomb coding).

Figure 7:
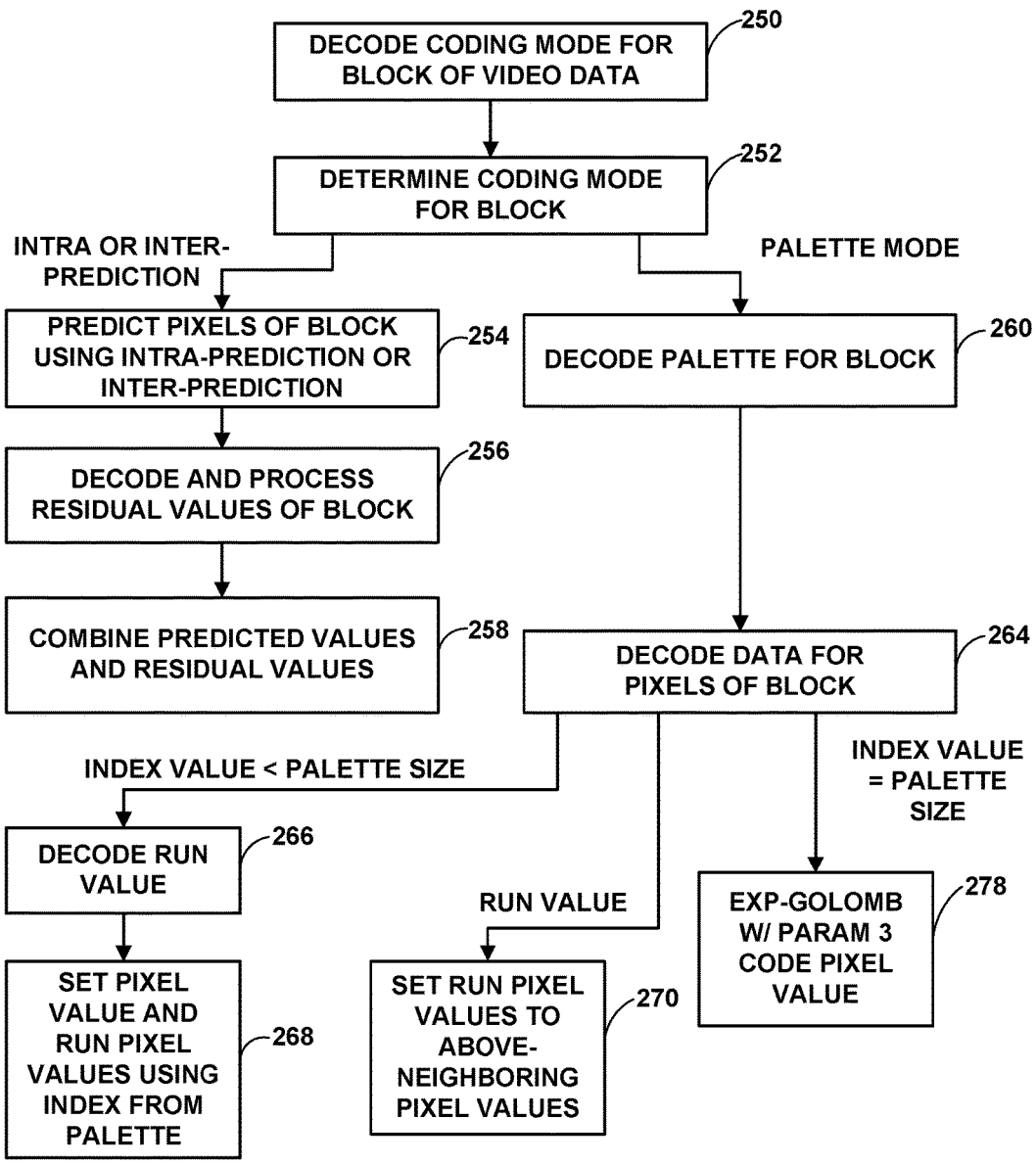
FIG. 7 is a flowchart illustrating another example method for decoding a block of video data in accordance with the techniques of this disclosure.

FIG. 7 is a flowchart illustrating another example method for decoding a block of video data in accordance with the techniques of this disclosure. The method of FIG. 7 may be performed by video decoder 30 and the components thereof (e.g., illustrated in FIG. 3). In general, the method of FIG. 7 conforms substantially to the method of FIG. 6. However, in FIG. 7, when the index value is equal to the palette size, palette-based decoding unit 165 may decode the pixel as an escape pixel, and in particular, decode the value for the escape pixel using exponential Golomb with parameter 3 coding (278).

In this manner, the method of FIG. 7 represents an example of a method including decoding an exponential Golomb codeword representative of at least a portion of the value for an escape pixel of a palette-mode coded block of video data, wherein decoding the exponential Golomb codeword comprises decoding the exponential Golomb codeword using exponential Golomb with parameter 3 decoding, and decoding the block using the value for the escape pixel.

It is to be recognized that depending on the example, certain acts or events of any of the techniques described herein can be performed in a different sequence, may be added, merged, or left out altogether (e.g., not all described acts or events are necessary for the practice of the techniques). Moreover, in certain examples, acts or events may be performed concurrently, e.g., through multi-threaded processing, interrupt processing, or multiple processors, rather than sequentially. In addition, while certain aspects of this disclosure are described as being performed by a single module or unit for purposes of clarity, it should be understood that the techniques of this disclosure may be performed by a combination of units or modules associated with a video coder.

Certain aspects of this disclosure have been described with respect to the developing HEVC standard for purposes of illustration. However, the techniques described in this disclosure may be useful for other video coding processes, including other standard or proprietary video coding processes not yet developed.

The techniques described above may be performed by video encoder 20 (FIGS. 1 and 2) and/or video decoder 30 (FIGS. 1 and 3), both of which may be generally referred to as a video coder. Likewise, video coding may refer to video encoding or video decoding, as applicable.

While particular combinations of various aspects of the techniques are described above, these combinations are provided merely to illustrate examples of the techniques described in this disclosure. Accordingly, the techniques of this disclosure should not be limited to these example combinations and may encompass any conceivable combination of the various aspects of the techniques described in this disclosure.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable gate arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method of decoding video data, the method comprising:

obtaining a palette that includes entries representing pixel values for a palette-code coded block of the video data;

determining that the palette-mode coded block of the video data includes an escape pixel that is not associated with any of the entries included in the palette and the entries included in the palette are not used to predict the escape pixel;

decoding an exponential Golomb codeword defining at least a portion of a value for a syntax element defining a chrominance or luminance value for the escape pixel of the palette-mode coded block of the video data, wherein decoding the exponential Golomb codeword comprises decoding the exponential Golomb codeword using exponential Golomb with parameter 3 decoding, and wherein decoding the exponential Golomb codeword using exponential Golomb with parameter 3 decoding comprises decoding the exponential Golomb codeword using a factor of $2^3$; and decoding the palette-mode coded block using the value for the syntax element defining the chrominance or luminance value for the escape pixel.

2. The method of claim 1, further comprising:

determining a quantization step size value for the palette-mode coded block using a quantization parameter for the palette-mode coded block; and determining a maximum quantized value for the escape pixel of the palette-mode coded block based on the quantization step size value,
wherein decoding the exponential Golomb codeword comprises decoding the exponential Golomb codeword using the maximum quantized value.

3. The method of claim 2, wherein determining the maximum quantized value comprises determining the maximum quantized value based only on the quantization step size value.

4. The method of claim 2, wherein determining the maximum quantized value comprises determining the maximum quantized value based on the quantization step size value, a quantization scale value, a right shift offset value, and a right shift parameter value, the method further comprising determining the quantization scale value, the right shift offset value, and the right shift parameter value from a look-up table.

5. The method of claim 4, wherein determining the maximum quantized value comprises determining the maximum quantized value without performing a clipping operation.

6. The method of claim 2, wherein determining the maximum quantized value comprises calculating the maximum quantized value without performing a division operation.

7. The method of claim 2, wherein determining the maximum quantized value comprises retrieving the maximum quantized value from a look-up table indexed by the quantization parameter.

8. The method of claim 7, further comprising determining the quantization parameter based on a color component that includes the escape pixel.

9. The method of claim 1, wherein at least the portion of the value comprises a second portion of the value, the method further comprising:
decoding a Golomb rice codeword representative of a first portion of the value for the escape pixel; and
combining the first portion and the second portion to produce the value for the escape pixel.

10. A device for decoding video data, the device comprising:
a memory configured to store video data; and
a video decoder implemented in circuitry and configured to:
obtain a palette that includes entries representing pixel values for a palette-mode coded block of the video data;
determine that the palette-mode coded block of the video data includes an escape pixel that is not associated with any of the entries included in the palette and the entries included in the palette are not used to predict the escape pixel;
decode an exponential Golomb codeword defining at least a portion of a value for a syntax element defining a chrominance or luminance value for the escape pixel of the palette-mode coded block of the stored video data, wherein the video decoder is configured to decode the exponential Golomb codeword using exponential Golomb with parameter 3 decoding, and wherein to decode the exponential Golomb codeword using exponential Golomb with parameter 3 decoding, the video decoder is configured to decode the exponential Golomb codeword using a factor of $2^3$; and
decode the palette-mode coded block using the value for the syntax element defining the chrominance or luminance value for the escape pixel.

11. The device of claim 10, wherein the video decoder is further configured to:
determine a quantization step size value for the palette-mode coded block using a quantization parameter for the palette-mode coded block; and
determine a maximum quantized value for the escape pixel of the palette-mode coded block based on the quantization step size value,
wherein the video decoder is configured to decode the exponential Golomb codeword using the maximum quantized value.

12. The device of claim 11, wherein the video decoder is configured to determine the maximum quantized value based only on the quantization step size value.

13. The device of claim 11, wherein the video decoder is configured to determine the maximum quantized value based on the quantization step size value, a quantization scale value, a right shift offset value, and a right shift parameter value, and wherein the video decoder is further configured to determine the quantization scale value, the right shift offset value, and the right shift parameter value from a look-up table.

14. The device of claim 13, wherein the video decoder is configured to determine the maximum quantized value without performing a clipping operation.

15. The device of claim 11, wherein the video decoder is configured to calculate the maximum quantized value without performing a division operation.

16. The device of claim 11, wherein the video decoder is configured to retrieve the maximum quantized value from a look-up table indexed by the quantization parameter.

17. The device of claim 10, wherein at least the portion of the value comprises a second portion of the value, and wherein the video decoder is further configured to:
decode a Golomb rice codeword representative of a first portion of the value for the escape pixel; and
combine the first portion and the second portion to produce the value for the escape pixel.

18. A device for decoding video data, the device comprising:
means for obtaining a palette that includes entries representing pixel values for a palette-mode coded block of the video data;
means for determining that the palette-mode coded block of the video data includes an escape pixel that is not associated with any of the entries included in the palette and the entries included in the palette are not used to predict the escape pixel;
means for decoding an exponential Golomb codeword defining at least a portion of a value for a syntax element defining a chrominance or luminance value for the escape pixel of the palette-mode coded block of the video data, wherein the means for decoding the exponential Golomb codeword comprise means for decoding the exponential Golomb codeword using exponential Golomb with parameter 3 decoding, and wherein the for decoding the exponential Golomb codeword using exponential Golomb with parameter 3 decoding comprise means for decoding the exponential Golomb codeword using a factor of $2^3$; and
means for decoding the palette-mode coded block using the value for the syntax element defining the chrominance or luminance value for the escape pixel.

19. The device of claim 18, further comprising:
means for determining a quantization step size value for the palette-mode coded block using a quantization parameter for the palette-mode coded block; and means for determining a maximum quantized value for the escape pixel of the palette-mode coded block based on the quantization step size value, wherein the means for decoding the exponential Golomb codeword comprises means for decoding the exponential Golomb codeword using the maximum quantized value.

20. The device of claim 18, further comprising:

means for decoding a Golomb rice codeword representative of a first portion of the value for the escape pixel; and means for combining the first portion and the second portion to produce the value for the escape pixel.

21. A non-transitory computer-readable storage medium having stored thereon instructions that, when executed, cause one or more processors of a video decoding device to:

obtain a palette that includes entries representing pixel values for a palette-mode coded block of the video data;

determine that the palette-mode coded block of the video data includes an escape pixel that is not associated with any of the entries included in the palette and the entries included in the palette are not used to predict the escape pixel;

decode an exponential Golomb codeword defining at least a portion of a value for a syntax element defining a chrominance or luminance value for the escape pixel of the palette-mode coded block of the video data, wherein the instructions that cause the processors to decode the exponential Golomb codeword comprise instructions that cause the processors to decode the exponential Golomb codeword using exponential Golomb with parameter 3 decoding, and wherein the instructions that cause the processor to decode the exponential Golomb codeword using exponential Golomb with parameter 3 decoding comprise instructions that cause the processor to decode the exponential Golomb codeword using a factor of $2^3$; and decode the palette-mode coded block using the value for the syntax element defining the chrominance or luminance value for the escape pixel.

22. The non-transitory computer-readable storage medium of claim 21, further comprising instructions that cause the processors to:

determine a quantization step size value for the palette-mode coded block using a quantization parameter for the palette-mode coded block; and determine a maximum quantized value for the escape pixel of the palette-mode coded block based on the quantization step size value, wherein the instructions that cause the processors to decode the exponential Golomb codeword comprise instructions that cause the processors to decode the exponential Golomb codeword using the maximum quantized value.

23. The non-transitory computer-readable storage medium of claim 21, wherein at least the portion of the value comprises a second portion of the value, further comprising instructions that cause the processor to decode a Golomb rice codeword representative of a first portion of a value for an escape pixel of a palette-mode coded block of video data; and combine the first portion and the second portion to produce the value for the escape pixel.

24. A method of encoding video data, the method comprising:

obtaining a palette that includes entries representing pixel values for a palette-mode coded block of the video data;

determining a value for a syntax element defining a chrominance or luminance value for an escape pixel of the palette-mode coded block of the video data, wherein the escape pixel is not associated with any of the entries included in the palette and the entries included in the palette are not used to predict the escape pixel; and encoding an exponential Golomb codeword defining at least a portion of the value for the syntax element defining the chrominance or luminance value for the escape pixel, wherein encoding the exponential Golomb codeword comprises encoding the exponential Golomb using exponential Golomb with parameter 3 encoding, and wherein encoding the exponential Golomb using exponential Golomb with parameter 3 encoding comprises encoding the exponential Golomb codeword using a factor of $2^3$.

25. The method of claim 24, further comprising:

determining a quantization step size value for the palette-mode coded block using a quantization parameter for the palette-mode coded block; and determining a maximum quantized value for the escape pixel of the palette-mode coded block based on the quantization step size value, wherein encoding the exponential Golomb codeword comprises encoding the exponential Golomb codeword using the maximum quantized value.

26. The method of claim 25, wherein determining the maximum quantized value comprises determining the maximum quantized value based only on the quantization step size value.

27. The method of claim 25, wherein determining the maximum quantized value comprises determining the maximum quantized value based on the quantization step size value, a quantization scale value, a right shift offset value, and a right shift parameter value, the method further comprising encoding values representative of the quantization scale value, the right shift offset value, and the right shift parameter value from a look-up table.

28. The method of claim 27, wherein determining the maximum quantized value comprises determining the maximum quantized value without performing a clipping operation.

29. The method of claim 25, wherein determining the maximum quantized value comprises calculating the maximum quantized value without performing a division operation.

30. The method of claim 25, wherein determining the maximum quantized value comprises retrieving the maximum quantized value from a look-up table indexed by the quantization parameter.

31. The method of claim 30, further comprising determining the quantization parameter based on a color component that includes the escape pixel.

32. The method of claim 24, wherein the at least portion comprises a second portion of the value, the method further comprising encoding a Golomb rice codeword representative of a first portion of the value for the escape pixel.

33. A device for encoding video data, the device comprising:

a memory configured to store at least a portion of the video data; and a video encoder implemented in circuitry and configured to:

obtain a palette that includes entries representing pixel values for a palette-mode coded block of the video data;

determine a value for a syntax element defining a chrominance or luminance value for an escape pixel of the palette-mode coded block of the video data, wherein the escape pixel is not associated with any of the entries included in the palette and the entries included in the palette are not used to predict the escape pixel; and encode an exponential Golomb codeword defining at least a portion of the value for the syntax element defining the chrominance or luminance value for the escape pixel, wherein the video encoder is configured to encode the exponential Golomb codeword using exponential Golomb with parameter 3 encoding, and wherein to encode the exponential Golomb codeword using exponential Golomb with parameter 3 encoding, the video encoder is configured to encode the exponential Golomb codeword using a factor of $2^3$.

34. The device of claim 33, wherein the video encoder is further configured to:

determine a quantization step size value for the palette-mode coded block using a quantization parameter for the palette-mode coded block; and determine a maximum quantized value for the escape pixel of the palette-mode coded block based on the quantization step size value, wherein the video encoder is configured to encode the exponential Golomb codeword using the maximum quantized value.

35. The device of claim 34, wherein the video encoder is configured to determine the maximum quantized value based only on the quantization step size value.

36. The device of claim 34, wherein the video encoder is configured to determine the maximum quantized value based on the quantization step size value, a quantization scale value, a right shift offset value, and a right shift parameter value, and wherein the video encoder is further configured to encode values representative of the quantization scale value, the right shift offset value, and the right shift parameter value from a look-up table.

37. The device of claim 36, wherein the video encoder is configured to determine the maximum quantized value without performing a clipping operation.

38. The device of claim 34, wherein the video encoder is configured to calculate the maximum quantized value without performing a division operation.

39. The device of claim 34, wherein the video encoder is configured to retrieve the maximum quantized value from a look-up table indexed by the quantization parameter.

40. The device of claim 33, wherein the at least portion comprises a second portion of the value, and wherein the video encoder is further configured to encode a Golomb rice codeword representative of a first portion of the value for the escape pixel.

41. A device for encoding video data, the device comprising:

means for obtaining a palette that includes entries representing pixel values for a palette-mode coded block of the video data;

means for determining a value for a syntax element defining a chrominance or luminance value for an escape pixel of the palette-mode coded block of video data, wherein the escape pixel is not associated with any of the entries included in the palette and the entries included in the palette are not used to predict the escape pixel; and means for encoding an exponential Golomb codeword defining a second portion of the value for the syntax element defining the chrominance or luminance value for the escape pixel, wherein the means for encoding the exponential Golomb codeword comprises means for encoding the exponential Golomb codeword using exponential Golomb with parameter 3 encoding, and wherein the means for encoding the exponential Golomb codeword using exponential Golomb with parameter 3 encoding comprise means for encoding the exponential Golomb codeword using a factor of $2^3$.

42. The device of claim 41, further comprising:

means for determining a quantization step size value for the palette-mode coded block using a quantization parameter for the palette-mode coded block; and means for determining a maximum quantized value for the escape pixel of the palette-mode coded block based on the quantization step size value, wherein the means for encoding the exponential Golomb codeword comprises means for encoding the exponential Golomb codeword using the maximum quantized value.

43. The device of claim 41, wherein the at least portion comprises a second portion, further comprising means for encoding a Golomb rice codeword representative of a first portion of the value for the escape pixel.

44. A non-transitory computer-readable storage medium having stored thereon instructions that, when executed, cause one or more processors of a video encoding device to:

obtain a palette that includes entries representing pixel values for a palette-mode coded block of the video data;

determine a value for a syntax element defining a chrominance or luminance value for an escape pixel of the palette-mode coded block of the video data, wherein the escape pixel is not associated with any of the entries included in the palette and the entries included in the palette are not used to predict the escape pixel; and encode an exponential Golomb codeword defining a second portion of the value for the syntax element defining the chrominance or luminance value for the escape pixel, wherein the instructions that cause the processors to encode the exponential Golomb codeword comprise instructions that cause the processors to encode the exponential Golomb codeword using exponential Golomb with parameter 3 encoding, and wherein the instructions that cause the processor to encode the exponential Golomb codeword using exponential Golomb with parameter 3 encoding comprise instructions that cause the processor to encode the exponential Golomb codeword using a factor of $2^3$.

45. The non-transitory computer-readable storage medium of claim 44, further comprising instructions that cause the processors to:

determine a quantization step size value for the palette-mode coded block using a quantization parameter for the palette-mode coded block; and determine a maximum quantized value for the escape pixel of the palette-mode coded block based on the quantization step size value, wherein the instructions that cause the processors to encode the exponential Golomb codeword comprise instructions that cause the processors to encode the exponential Golomb codeword using the maximum quantized value.

46. The non-transitory computer-readable storage medium of claim 44, wherein the at least portion comprises a second portion of the value for the escape pixel, further comprising instructions that cause the processor to encode a Golomb rice codeword representative of a first portion of the value for the escape pixel.

\* \* \* \* \*